US007570506B2

(12) United States Patent
Koide

(10) Patent No.: US 7,570,506 B2
(45) Date of Patent: Aug. 4, 2009

(54) FERROELECTRIC MEMORY DEVICE AND ELECTRONIC APPARATUS

(75) Inventor: Yasunori Koide, Matsumoto (JP)

(73) Assignee: Seiko Epson Corporation (JP)

( * ) Notice: Subject to any disclaimer, the term of this patent is extended or adjusted under 35 U.S.C. 154(b) by 42 days.

(21) Appl. No.: 11/848,494

(22) Filed: Aug. 31, 2007

(65) Prior Publication Data

US 2008/0055961 A1 Mar. 6, 2008

(30) Foreign Application Priority Data

Sep. 1, 2006 (JP) ............................. 2006-238095

(51) Int. Cl.
*G11C 11/22* (2006.01)
(52) U.S. Cl. .................... 365/145; 365/205; 365/189.09
(58) Field of Classification Search ................. 365/145, 365/149, 203, 205, 207, 222
See application file for complete search history.

(56) References Cited

U.S. PATENT DOCUMENTS 6,233,170 B1  5/2001  Yamada 6,487,103 B2  11/2002  Yamamoto et al.
6,650,158 B2 *  11/2003  Eliason ........................ 327/203
6,934,214 B2 *  8/2005  Fujisawa et al. ........ 365/230.03
7,088,605 B2 *  8/2006  Lin ............................ 365/145

FOREIGN PATENT DOCUMENTS

JP  2000-187990  7/2000
JP  2002-133857  5/2002

OTHER PUBLICATIONS

"Bitline GND Sensing Technique for Low-Voltage Operation FeRAM"; IEEE Journal of Solid State Circuits, vol. 37. No. 5., May 2002.

* cited by examiner

*Primary Examiner*—Gene N. Auduong
(74) *Attorney, Agent, or Firm*—Harness, Dickey & Pierce, P.L.C.

(57) ABSTRACT

A ferroelectric memory device includes: a first p-channel type MISFET connected between a first bit line and a first node; a second p-channel type MISFET connected between a second bit line and a second node; a first negative potential generation circuit connected to the first node; and a second negative potential generation circuit connected to the second node, wherein a gate terminal of the first p-channel type MISFET and the second node are connected to each other, and a gate terminal of the second p-channel type MISFET and the first node are connected to each other.

19 Claims, 20 Drawing Sheets

US 7,570,506 B2

FERROELECTRIC MEMORY DEVICE AND ELECTRONIC APPARATUS

The entire disclosure of Japanese Patent Application No. 2006-238095, filed Sep. 1, 2006 is expressly incorporated by reference herein.

BACKGROUND

1. Technical Field

The invention relates to ferroelectric memory devices, and more particularly, to sense amplifier circuits, equalizer circuits and positive potential converter circuits for read-out operations of ferroelectric memory devices.

2. Related Art

A ferroelectric memory device (FeRAM) may generally use a method using a latch type sense amplifier circuit for its read-out operation. For example, Japanese laid-open patent application JP-A-2000-187990 (corresponding to U.S. Pat. No. 6,233,170) (referred to as a "first patent document") is an example of related art.

However, in this case, a voltage that is applied to a plate line is voltage-divided into a ferroelectric capacitor capacitance (Cs) and a bit line capacitance (Cb1). Accordingly, a sufficient potential would not be applied to the ferroelectric capacitor due to the bit line capacitance (Cb1). Also, a difference in the bit line voltage is amplified by the sense amplifier for read-out. Therefore, the more the bit line capacitance (Cb1) increases, the smaller the bit line voltage becomes, which results in a smaller sensing margin.

In this connection, read-out circuits that are capable of virtually fixing the bit line to the ground potential are being examined. For example, Japanese laid-open patent application JP-A-2002-133857 (corresponding to U.S. Pat. No. 648, 703) (referred to as a "second patent document"), and IEEE Journal of Solid-State Circuits, Vol. 37, No. 5, May 2003 "Bit line GND Sensing Technique for Low-Voltage Operation FeRAM" are examples of related art.

(1) However, as described below in greater detail, the use of the circuit described in the aforementioned second patent document entails the following problems: (a) each of the elements composing the circuit requires fine fitting according to the ferroelectric characteristics; (b) the timing at which the sensing margin becomes maximum may change; (c) through-current may flow through the inverter during read-out operation; and (d) the circuit is large in area.

(2) Furthermore, in the circuit described in the aforementioned second patent document, the read-out operation is conducted through transferring the charge read out from the memory cell to a capacitor that is charged to a negative potential. Therefore, negative potential nodes (for example, $V_{MN}$ and VTH in FIG. 3 of the document) are generated. However, these nodes are put in a floating state on standby, such that the initial potential becomes unstable. As the initial potential changes, the output potential at read-out also changes, which results in a reduced sensing margin.

(3) Moreover, in the circuit described in the aforementioned second patent document, the read-out operation is conducted through amplifying a potential difference between the node VMN when the charge read out from the memory cell is "0" data and the node VMN when the charge is "1" data. However, in order to amplify the potential difference by a sense amplifier, the amplification needs to be conducted after the negative potential has been converted to a positive potential. For this reason, with the circuit described in the aforementioned second patent document, after the negative potential is converted to a positive potential by using a voltage shift circuit [7], the read-out operation is conducted by a sense amplifier circuit [5]. However, the voltage shift circuit [7] described in the aforementioned second patent document has a large conversion loss, causing a problem in that the potential difference on the node VMN becomes smaller after the conversion. It is noted that numbers in the brackets above are reference numerals used in the document.

SUMMARY

In accordance with an advantage of some aspects of the invention, a ferroelectric memory device that can solve the aforementioned problems can be provided. More particularly, it is possible to provide a variety of circuits (for example, a sense amplifier circuit, an equalizer circuit, a positive potential converter circuit, and the like) necessary to read out data of the ferroelectric memory device that can solve the aforementioned problems.

(1) A ferroelectric memory device in accordance with an embodiment of the invention includes: a first p-channel type MISFET connected between a first bit line and a first node; a second p-channel type MISFET connected between a second bit line and a second node; a first negative potential generation circuit connected to the first node; and a second negative potential generation circuit connected to the second node, wherein a gate terminal of the first p-channel type MISFET and the second node are connected to each other, and a gate terminal of the second p-channel type MISFET and the first node are connected to each other.

With the structure described above, the potential on the first and second bit lines can be lowered to a level near the ground potential by the first and second negative potential generation circuits, such that the voltage to be applied to the ferroelectric capacitor can be made greater. The read-out characteristic of the ferroelectric memory device can be improved.

Also, as the influence of the bit line capacitance is reduced, the bit line can be made longer, and the memory capacity can be increased.

Moreover, because the gate terminal of the first p-channel type MISFET and the second node are connected to each other, and the gate terminal of the second p-channel type MISFET and the first node are connected to each other, when the potential on one of the first and second nodes on the "1" data side exceeds the threshold value of the p-channel type MISFET, the potential on the other node (on the "0" data side) stops rising. Accordingly, read-out data can be fixed with the potential difference between these nodes. Also, from this moment onward, the potentials on the first node and the second node are fixed above and below the threshold value, respectively, such that designing circuits in subsequent stages can be facilitated.

For example, a substrate potential of the first p-channel type MISFET and the second p-channel type MISFET is a ground potential. With such a structure, when the rise in the potentials on the gate terminals, in other words, on the first and second nodes, exceeds the threshold value, the first and second p-channel type MISFETs can be turned off.

For example, the substrate potential of the first p-channel type MISFET may be the same as the potential on the terminal of the first p-channel type MISFET on the side of the first bit line, and the substrate potential of the second p-channel type MISFET may be the same as the potential on the terminal of the second p-channel type MISFET on the side of the second bit line. With such a structure, the threshold values of the first and second p-channel type MISFETs can be controlled by the bit line potentials, such that the difference in the rate of potential rise at the first node and the second node can be better stabilized.

For example, the first negative potential generation circuit may be composed of a first capacitor connected between the first node and a first line, and the second negative potential generation circuit may be composed of a second capacitor connected between the second node and the first line. With this structure, a negative potential can be readily generated.

For example, each of the first capacitor and the second capacitor may be composed of a ferroelectric capacitor. With this structure, the capacitors with a smaller area but a large capacity can be obtained.

For example, a discharge circuit may be connected to the first bit line and the second bit line. With this structure, the bit lines can be discharged.

For example, a charge supply circuit may be connected to the first node and the second node. With this structure, the charge can be transferred at a higher rate to the first and second nodes.

For example, the charge supply circuit may be composed of a third p-channel type MISFET and a fourth p-channel type MISFET, wherein the third p-channel type MISFET has one end connected to the first node, another end connected to a first potential, and a gate terminal connected to the second node; and the fourth p-channel type MISFET has one end connected to the second node, another end connected to the first potential, and a gate terminal connected to the first node. With this structure, the charge is supplied from the first potential through the p-channel type MISFETs to the first and second nodes, the potential on the first and second nodes can be elevated at a higher rate, and therefore the operation speed can be improved. Also, because the node on the "1" data side is at the first potential, designing circuits in subsequent stages can be facilitated.

For example, the substrate potential of the third p-channel type MISFET may be the same as the ground potential or the potential on the terminal of the first p-channel type MISFET on the first bit line side, and the substrate potential of the fourth p-channel type MISFET may be the same as the ground potential or the potential on the terminal of the second p-channel type MISFET on the second bit line side. With this structure, the threshold values of the third and fourth p-channel type MISFETs can be controlled by the bit line potential, such that the difference in the rate of potential elevation at the first node and the second node can be better stabilized.

For example, the gate terminal of the third p-channel type MISFET and the second node may be connected to each other through a third capacitor, and the gate terminal of the fourth p-channel type MISFET and the first node may be connected to each other through a fourth capacitor. With this structure, the p-channel type MISFET on the "0" data side can be set to OFF state quicker.

For example, a first equalizer circuit is connected between the first node and the second node for setting the potential on these nodes to a specified potential. With this structure, the first node and the second node can be fixed at the specified potential on standby. Accordingly, the initial potential is stabilized, and the sensing operation is stabilized. Also, the read-out characteristic can be improved.

For example, the first equalizer circuit may be composed of a fifth p-channel type MISFET, wherein the fifth p-channel type MISFET has one end connected to the first node, another end connected to the second node, and a gate terminal connected to a third negative potential generation circuit, and its substrate potential is a first potential. With this structure, the first node and the second node can be equalized at the same potential.

For example, the first equalizer circuit further includes a sixth p-channel type MISFET and a seventh p-channel type MISFET, wherein the sixth p-channel type MISFET has one end connected to the first node, another end connected to the first potential, and a gate terminal connected to the third negative potential generation circuit, and its substrate potential is the first potential; and the seventh p-channel type MISFET has one end connected to the second node, another end connected to the first potential, and a gate terminal connected to the third negative potential generation circuit, and its substrate potential is the first potential. With this structure, the first and second nodes can be equalized at a second potential.

For example, a clamp circuit may be connected to an output of the third negative potential generation circuit. With this structure, the potential on the output node can be fixed within a specified range.

For example, the clamp circuit may be a resistance connected between the output and the first potential. With this structure, the clamp circuit can be provided with a relatively simple structure.

For example, a second equalizer circuit is connected between the gate terminal of the third p-channel type MISFET and the gate terminal of the fourth p-channel type MISFET for setting the potential on those gate terminals at a specified potential. With this structure, the gate terminal of each of the p-channel type MISFET can be set to a specified potential.

For example, the ferroelectric memory device in accordance with an aspect of the embodiment may include a positive potential converter circuit having an input section connected to the first node and the second node, wherein the positive potential converter circuit converts the potential on the first node to a second potential that is a positive potential and the potential on the second node to a third potential that is lower than the second potential when the potential on the first node is higher than the potential on the second node, and converts the potential on the second node to the second potential and the potential on the first node to the third potential when the potential on the second node is higher than the potential on the first node. With this structure, it is possible to generate outputs as the first potential and the second potential according to a potential difference between the first node and the second node.

For example, at the time of operation of the positive potential converter circuit, the potentials on the first and second nodes may be a negative potential or the ground potential. In this manner, even when the potentials on the first and second nodes are negative potentials (lower than 0V), the potential difference between then can be taken out as a positive potential (higher than 0V).

For example, a ferroelectric memory may be connected to each of the first bit line and the second bit line. With this structure, the invention can be applied to so-called 2T2C ferroelectric memories.

For example, a ferroelectric memory may be connected to the first bit line, and a reference potential may be applied to the second bit line. With this structure, the invention can be applied to so-called 1T1C ferroelectric memories.

(2) An electronic apparatus in accordance with an embodiment of the invention has the ferroelectric memory device described above. It is noted that the "electronic apparatus" refers to any apparatus in general that is equipped with a ferroelectric memory device in accordance with the invention and performs a specified function. The electronic apparatus is not limited to a specific structure, and may include devices that require memory devices, such as, for example, computer devices in general equipped with the ferroelectric memory device, cellular phones, PHS, PDA, electronic notepads, and IC cards.

DESCRIPTION OF EXEMPLARY EMBODIMENTS

Embodiments of the invention are described in detail below with reference to the accompanying drawings. It is noted that elements having the same functions shall be appended with the same or related reference numbers, and their description shall not be repeated.

Figure 1:
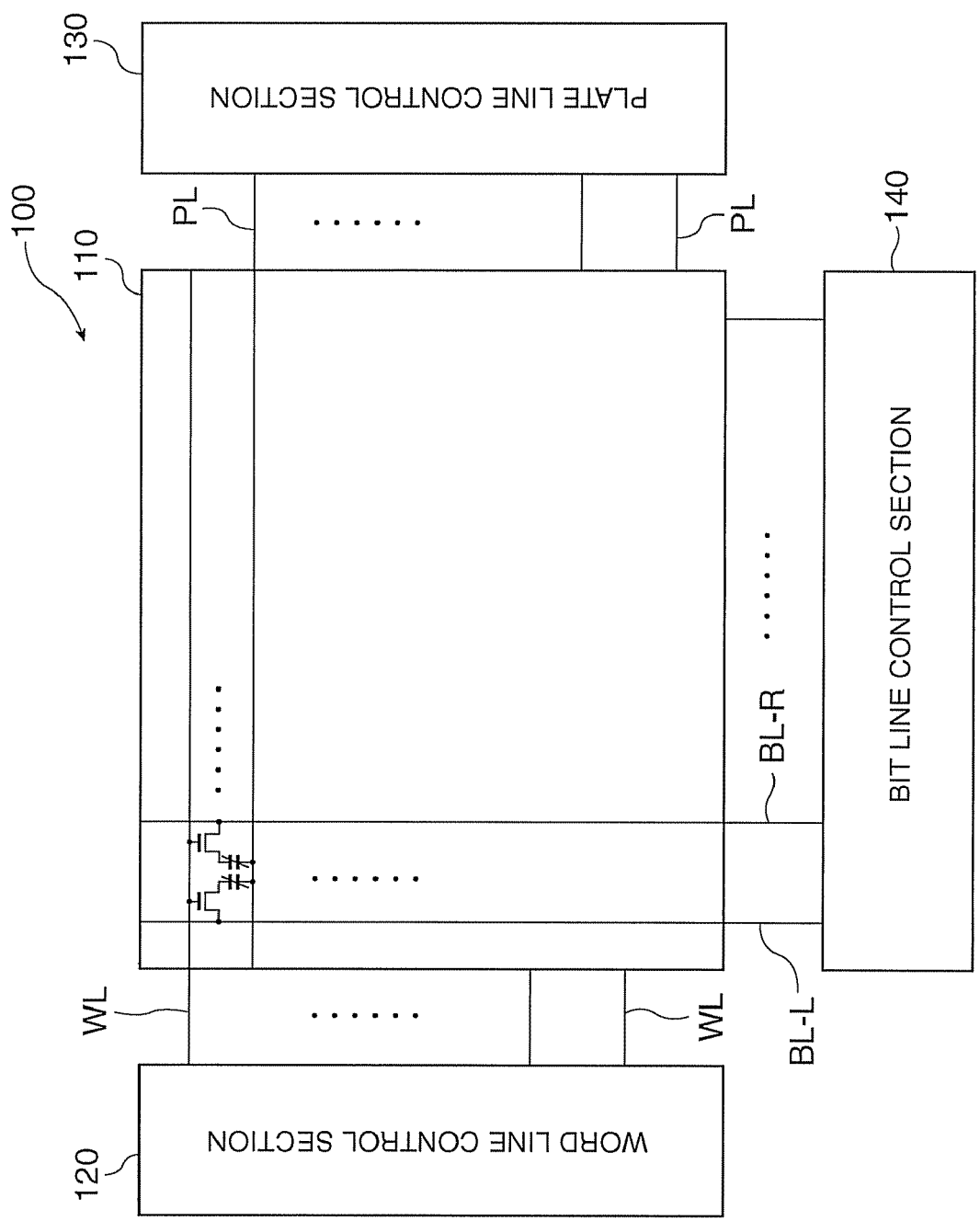
FIG. 1 is a block diagram showing a structure of a ferroelectric memory.

FIG. 1 is a block diagram of a structure of a ferroelectric memory device. As shown in the figure, the ferroelectric memory device 100 includes a memory cell array 110 and peripheral circuit sections (120, 130, 140 and the like). The memory cell array 110 is formed from a plurality of memory cells arranged in an array, wherein the memory cells are disposed at intersections between word lines WL and bit lines BL-L and BL-R, respectively. The embodiment is described here, using a 2T2C cell as an example. Accordingly, each data set is stored by two transistors and two ferroelectric capacitors that are connected to the bit lines BL-L and BL-R, respectively. Furthermore, a word line control section 120 and a plate line control section 130 composing the peripheral circuit control voltages on plural word lines WL and plural plate lines PL. By this control, data stored in the memory cells MC are readout onto the plural bit lines BL, or data supplied from outside are written to the memory cells MC through the bit lines BL. Such readout and writing operations are performed by a bit line control section 140.

Sense amplifier circuits, equalizer circuits and positive potential converter circuits in accordance with the embodiment of the invention are described below in this order.

1) Sense Amplifier Circuit

First Sense Amplifier Circuit

Figure 2:
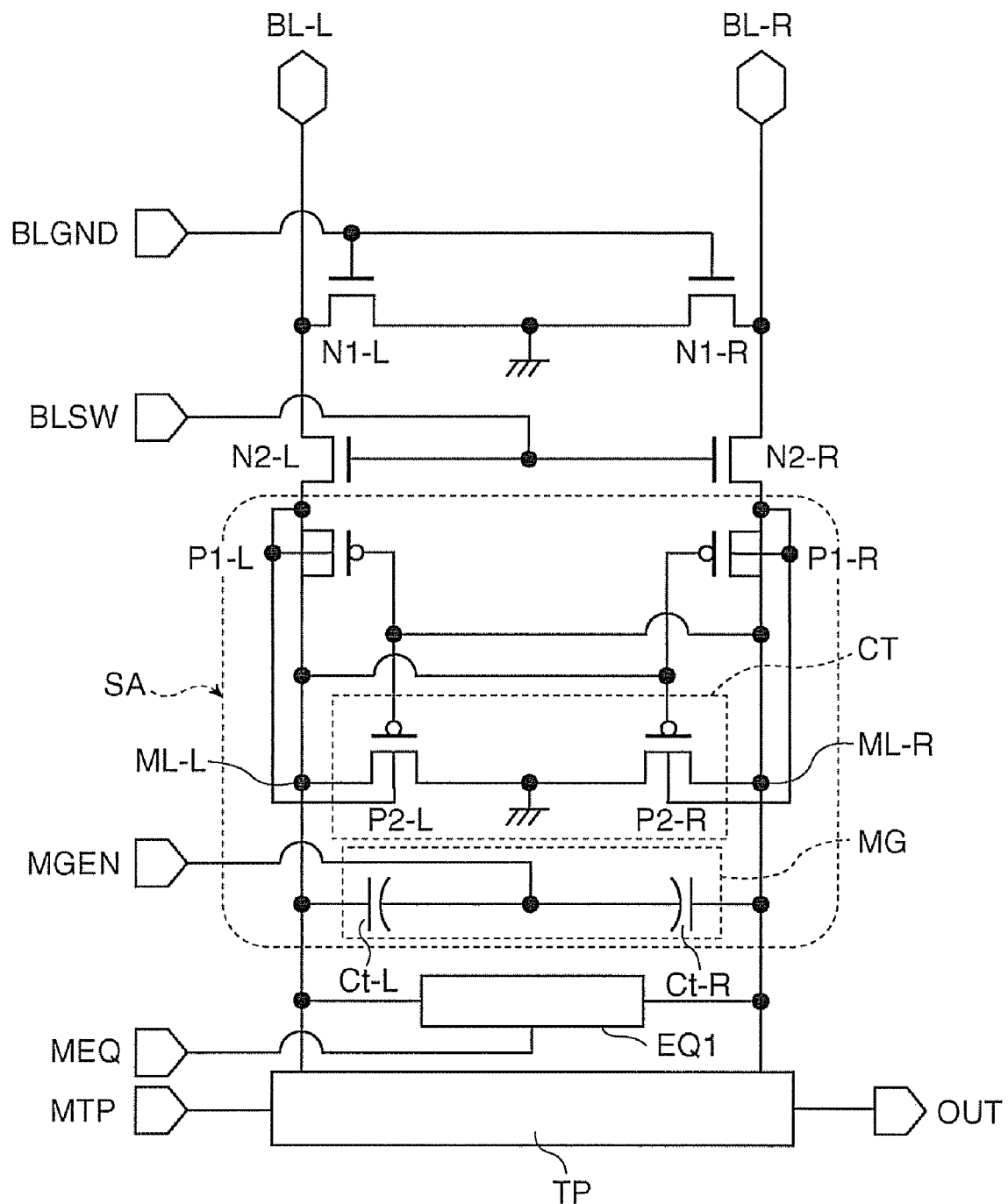
FIG. 2 is a circuit diagram showing a structure of a first sense amplifier circuit in accordance with an embodiment of the invention.

FIG. 2 is a circuit diagram of a structure of a first sense amplifier circuit in accordance with an embodiment of the invention. As shown in the figure, the bit lines BL-L and BL-R are connected to a first node ML-L and a second node ML-R through p-channel type MISFETs P1-L and P1-R, respectively. Furthermore, a gate terminal of the p-channel type MISFET P1-L is connected to the second node ML-R, and a gate terminal of the p-channel type MISFET P1-R is connected to the first node ML-L. In this manner, one ends of the two p-channel type MISFETs P1-L and P1-R are cross-connected to their gate terminals. A substrate potential (back gate potential) of the p-channel type MISFETs P1-L and P1-R may be the ground potential, and more preferably, the same potential as the potential on the terminal (first terminal) thereof on the bit line side. This is because, the higher the substrate potential, the easier the MISFETs would turn on. In the present specification, source and drain regions of the MISFET may be referred to as a first end and a second end, or one end and the other end, respectively.

Also, a negative potential generation circuit MG is connected to the first node ML-L and the second node ML-R. The negative potential generation circuit MG is formed from a ferroelectric capacitor Ct-L connected to the first node ML-L and a ferroelectric capacitor Ct-R connected to the second node ML-R, and the other ends of the ferroelectric capacitors are commonly connected to a MGEN signal line. It is noted that, hereafter, signals and the corresponding signal lines may be indicated by the same signs.

Figure 5:
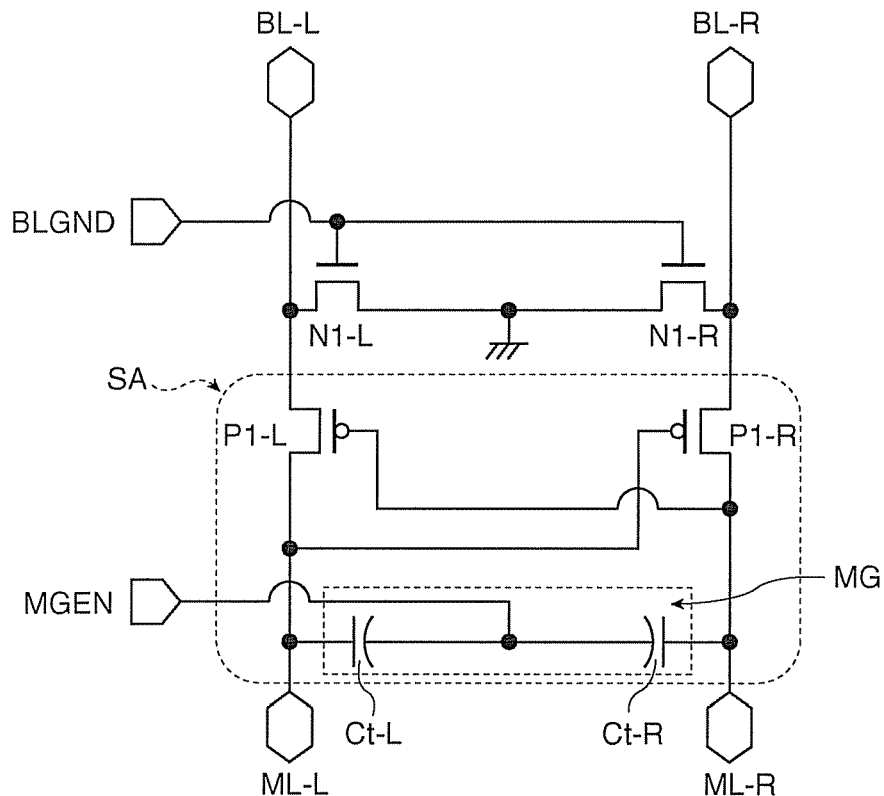
FIG. 5 is a circuit diagram showing a structure of a main portion of the first sense amplifier circuit.

The negative potential generation circuit MG and the cross-connected two p-channel type MISFETs P1-L and P1-R compose a sense amplifier SA (see FIG. 5).

Also, a charge transfer circuit (charge supply circuit) CT is connected between the first node ML-L and the second node ML-R. The charge transfer circuit CT is formed from p-channel type MISFETs P2-L and P2-R that are connected in series between the first node ML-L and the second node ML-R. Connection nodes of the p-channel type MISFETs P2-L and P2-R are connected to the ground potential (ground, GND), a gate terminal of the p-channel type MISFET P2-L is connected to the second node ML-R, and a gate terminal of the p-channel type MISFET P2-R is connected to the first node ML-L. The substrate potential (back gate potential) of the p-channel type MISFETs P2-L and P2-R may be the ground potential, and more preferably, the same potential as the potential on the terminals (first ends) of the p-channel type MISFETs P1-L and P1-R on the bit line side. This is because, the higher the substrate potential, the easier the MISFETs would turn on.

It is noted that the bit lines BL-L and BL-R are connected to a circuit that discharges each of the bit lines to the ground potential. The circuit is formed from an n-channel type MISFET N1-L connected between the bit line BL-L and the ground potential (first potential), and an n-channel type MISFET N1-R connected between the bit line BL-R and the ground potential (first potential). Their gate terminals are connected to a BLGND line.

Also, switching transistors (N2-L, N2-R) are connected between the bit lines BL-L and BL-R and the sense amplifier circuit SA. More specifically, the switching transistor N2-L is connected between the bit line BL-L and the p-channel type MISFET P1-L and the switching transistor N2-R is connected between the bit line BL-R and the p-channel type MISFET P1-R. Gate terminals of these switching transistors are connected to a BLSW line. These switching transistors are composed of n-channel type MISFETs.

Also, an equalizer circuit EQ1 is connected between the first node ML-L and the second node ML-R. The equalizer circuit EQ1 is a circuit that brings the potentials on the first node ML-L and the second node ML-R that have become negative potential nodes to the same potential (for example, the ground potential). The equalizer circuit EQ1 is connected to a MEQ line, and controlled by MEQ signals. The equalizer circuit shall be described in greater detail in "2) Equalizer Circuit" below.

Also, a positive potential converter circuit TP is connected to the first node ML-L and the second node ML-R. The positive potential converter circuit TP has input sections that are connected to the first and second nodes ML-L and ML-R, respectively, and generates an output according to a potential difference between the first node and the second node and outputs the same through its output section OUT. For example, the positive potential converter circuit TP generates a positive potential output according to a potential difference between the first and second nodes that are negative potential nodes and output the same through its output sections OUT-R and OUT-L (see FIG. 4, FIG. 14). The positive potential converter circuit TP is connected to a MTP line, and controlled by MTP signals. The positive potential converter circuit shall be described in greater detail in "3) Positive Potential Converter Circuit" below.

Figure 3A:
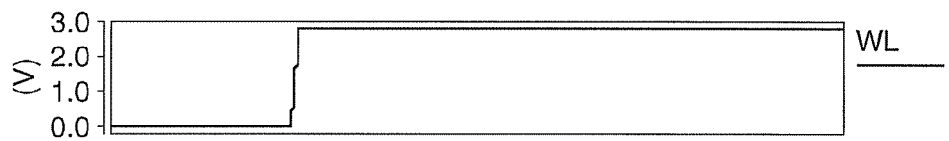
FIGS. 3A-3F are timing charts at the time of reading of the ferroelectric memory device.
Figure 3B:
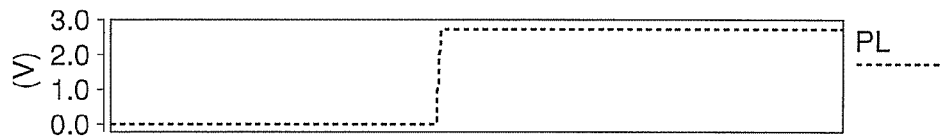
Figure 3C:
Figure 3D:
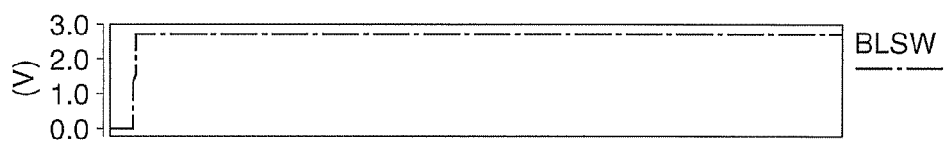
Figure 3E:
Figure 3F:
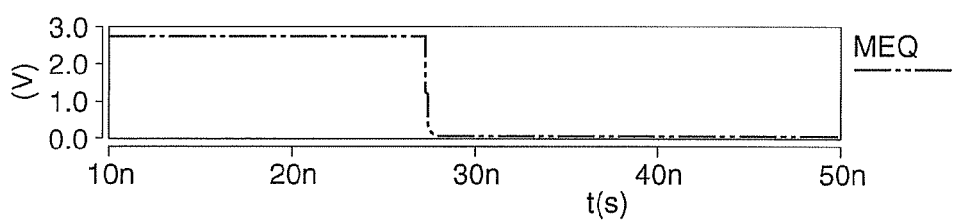

FIGS. 3A-3F are timing charts at the time of reading of the ferroelectric memory device. As shown in the charts, the BLSW line is set to H level, thereby connecting the sense amplifier circuit SA to the bit lines BL-L and BL-R (FIG. 3D). Then, the word line WL is set to H level (see FIG. 3A). Then the BLGND line is set to L level, whereby the bit lines BL-L and BL-R that have been discharged to the ground potential are brought in a floating state (FIG. 3C). Then, the MEQ line is set to L level, thereby turning off the equalizer circuit (FIG. 3F).

Then, the plate line PL is set to H level (FIG. 3B), thereby transferring the charge from the memory cell to the bit lines BL-L and BL-R. Then, the potential on the MGEN line (first line) is changed from H level to L level, thereby operating the negative potential generation circuit MG (FIG. 3E).

Figure 4A:
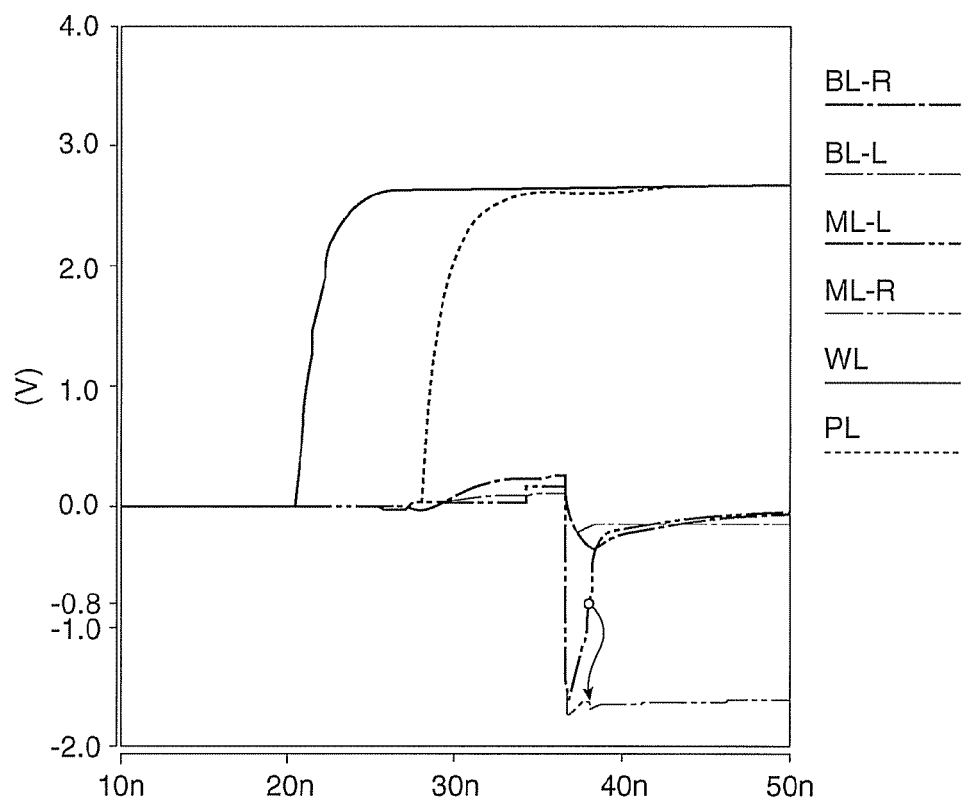
FIGS. 4A-4C show simulation results of potentials at the time of read-out on the bit lines BL-L and BL-R, and the first and second nodes ML-L and ML-R.
Figure 4B:
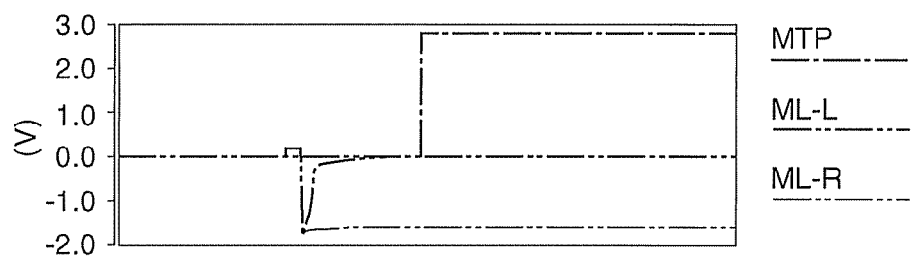
Figure 4C:
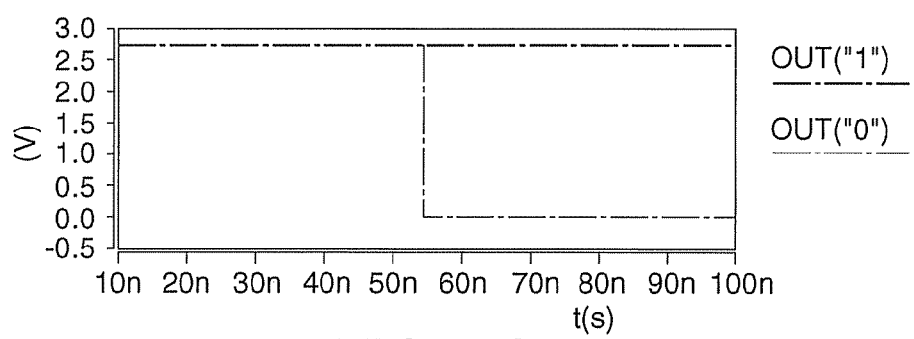

Simulation results of the potentials on the bit lines BL-L and BL-R, and the first and second nodes ML-L and ML-R at the time of read-out are shown in FIGS. 4A-4C. As shown in FIG. 4A, the potentials on the bit lines BL-L and BL-R gradually rise due to the charge transferred from the memory cell (ferroelectric capacitor). In this instance, the potential on the bit line on the "1" data side (BL-L in FIG. 4A) rises faster. On the other hand, due to the change in the potential on the MGEN line to L level, the potentials on the first and second nodes ML-L and ML-R rapidly lower, and become negative potentials lower than the threshold value Vth of the p-channel type MISFET (−0.8V in this case). As a result, the p-channel type MISFETs P1-L and P1-R are placed in ON state. Thereafter, the potentials on the first and second nodes ML-L and ML-R rise due to the charge transferred from the bit lines. In this instance, the potential on the node (ML-L in FIG. 4A) connected to the bit line on the "1" data side (BL-L in FIG. 4A) rises faster. Accordingly, when the potential on the node (ML-L) becomes higher than the threshold value Vth, the p-channel type MISFET P1-R turns off, and the potential on the other node (ML-R) stops rising. Accordingly, at this moment, read-out data is fixed.

Then, as shown in FIG. 4B, the potential on the MTP line is changed from L level to H level, thereby turning on the positive potential converter circuit TP. As a result, as shown in FIG. 4C, the potential difference between the first and second nodes ML-L and ML-R can be taken out as output data OUT-L and OUT-R, respectively. In FIG. 4C, the output data OUT-L is "1," and the output data OUT-R is "0."

In this manner, according to the first sense amplifier circuit, the gate terminals of the p-channel type MISFETs P1-L and P1-R connected to the negative potential nodes (ML-L and ML-R) are cross-connected, such that, by using the rise in the potential on the node on the "1" data side among them, the p-channel type MISFET connected to the node on the "0" data side can be turned off (see FIG. 5). Accordingly, the potential difference at the negative potential nodes at this moment or thereafter can be taken out as output data. FIG. 5 is a circuit diagram of a structure of the main portion of the first sense amplifier circuit. The same sections as those shown in FIG. 2 are appended with the same codes.

In particular, with the structure of the first sense amplifier circuit and its driving method (data read-out method), the following advantages (1)-(5) are achieved.

(1) For example, compared to the circuit described in the first patent document described above, the voltage to be applied to the ferroelectric capacitor can be made greater, as the potentials on the bit lines BL-L and BL-R lower to a level adjacent to the ground potential. Accordingly, the charge stored in the ferroelectric capacitor can be read out in a greater amount. Also, the read-out speed can be improved.

(2) Also, as the influence of the bit line capacitance can be reduced, the trend toward even greater memory capacity can be accommodated. In other words, even when the number of memories increases and the bit lines become longer, the read-out accuracy can be maintained.

(3) Furthermore, among the potentials on the first and second nodes (ML-L and ML-R), one of them is fixed above the threshold value Vth and the other fixed below the threshold value Vth, such that designing circuits in the succeeding stages (for example, the positive potential converter circuit) becomes easier.

Figure 6:
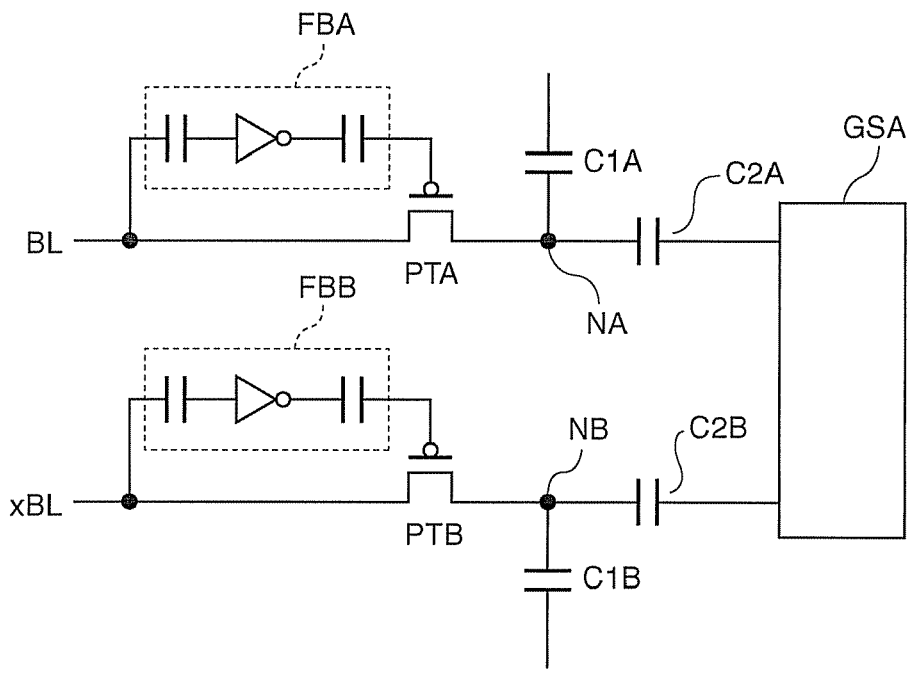
FIG. 6 is a circuit diagram of a circuit for comparison to be used for describing the effect of the first sense amplifier circuit.

(4) Moreover, compared to the circuit shown in FIG. 6, an inverter is not used, such that the through-current can be reduced. Also, the number of device elements composing the circuits can be reduced, such that the layout area can be reduced to about 30% according to the study conducted by the inventors. Also, with the first sense amplifier circuit, circuit fitting becomes easier. For example, in the circuit shown in FIG. 6, fine adjustment of the characteristics (for example, threshold values and capacitances) of the composing elements is required, and their fabrication is difficult. In contrast, in the first sense amplifier circuit, such settings are less required. FIG. 6 is a circuit for comparison for describing the effects of the first sense amplifier circuit. FBA and FBB denote feed back circuits, PTA and PTB denote p-channel type MISFETs, C1A and C1B denote capacitors, NA and NB denote nodes, C2A and C2B denote capacitors, and GSA denotes an ordinary sense amplifier circuit.

(5) Furthermore, by the charge transfer circuit CT, the rise in the potentials on the first and second nodes ML-L and ML-R is promoted, such that the time for either of the nodes to exceed the threshold value Vth is shortened. Accordingly, the read-out speed is improved. Also, by the equalizer circuit EQ1, initial potentials on the first and second nodes ML-L and ML-R are fixed, such that the read-out operation can be stabilized. In particular, the phenomenon in which the potentials on the first and second nodes ML-L and ML-R both can be lowered only to potentials greater than the threshold value Vth can be reduced. Also, by the positive potential converter circuit TP, the potential difference between the first and second nodes that are negative potential nodes can be effectively taken out as positive potential outputs OUT-L and OUT-R.

Second Sense Amplifier Circuit

Figure 7:
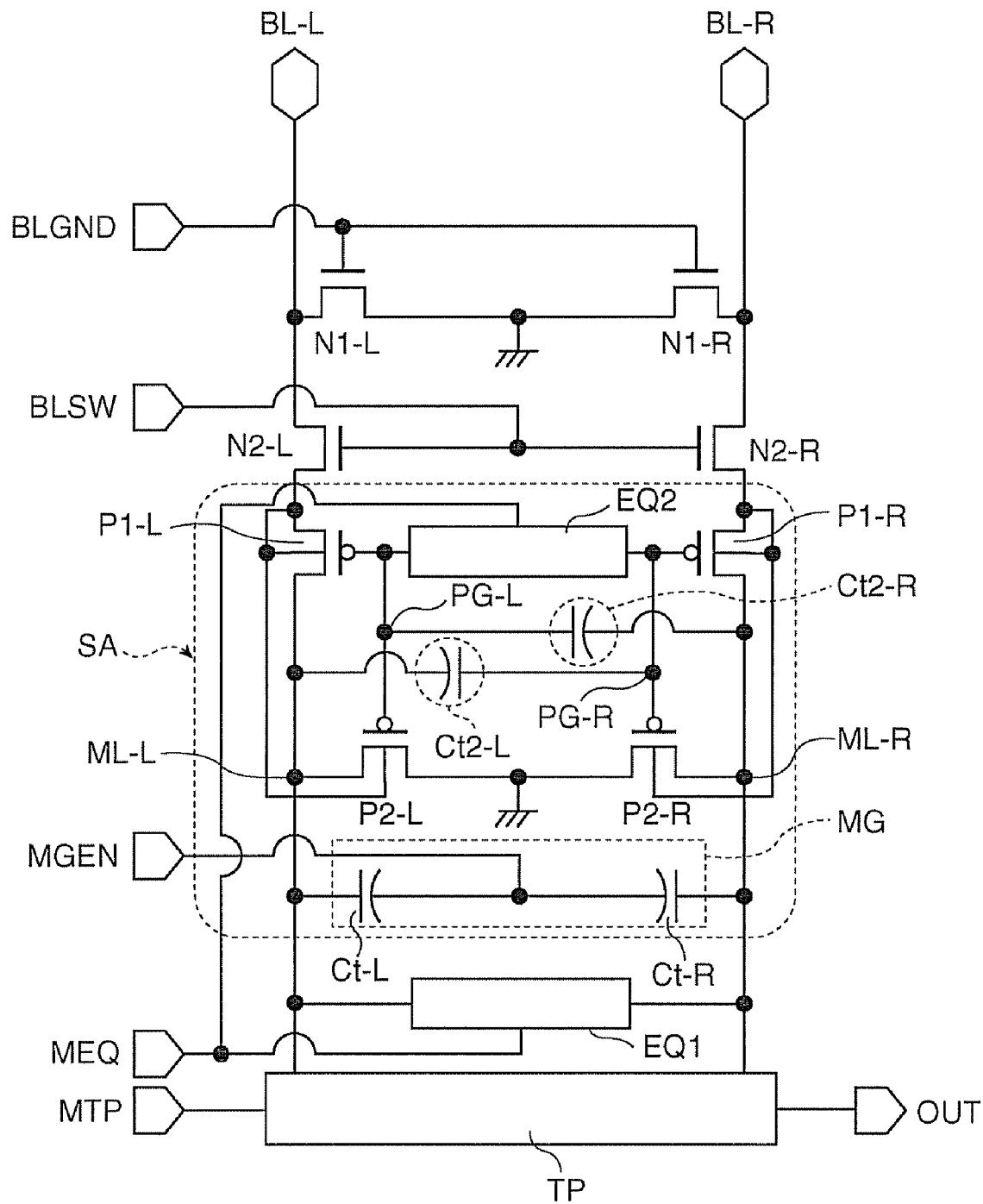
FIG. 7 is a circuit diagram of a structure of a second sense amplifier circuit in accordance with an embodiment of the invention.

FIG. 7 is a circuit diagram of a structure of a second sense amplifier circuit in accordance with an embodiment of the invention. The second sense amplifier circuit is different from the first sense amplifier circuit in that a potential transfer circuit composed of a ferroelectric capacitor Ct2-L is connected between a gate terminal (node PG-R) of a p-channel type MISFET P2-R and a first node ML-L, and a potential transfer circuit composed of a ferroelectric capacitor Ct2-R is connected between a gate terminal (node PG-L) of a p-channel type MISFET P2-L and a second node ML-R. Furthermore, it is different from the first sense amplifier circuit in that an equalizer circuit EQ2 is connected between gate terminals (node PG-L) of the p-channel type MISFETs P1-L and P2-L and gate terminals (node PG-R) of the p-channel type MISFETs P1-R and P2-R. The equalizer circuit EQ2 is also connected to a MEQ line, and controlled by MEQ signals.

With this structure, a change in the potential on the first or second node can be instantaneously transferred to the gate terminal of the p-channel type MISFET, the p-channel type MISFET (P2-R) connected to the node on the "0" data side (ML-R in FIG. 8) can be quickly turned off, and the rise in the potential on the node on the "0" data side (ML-R) can be stopped much earlier.

Figure 8A:
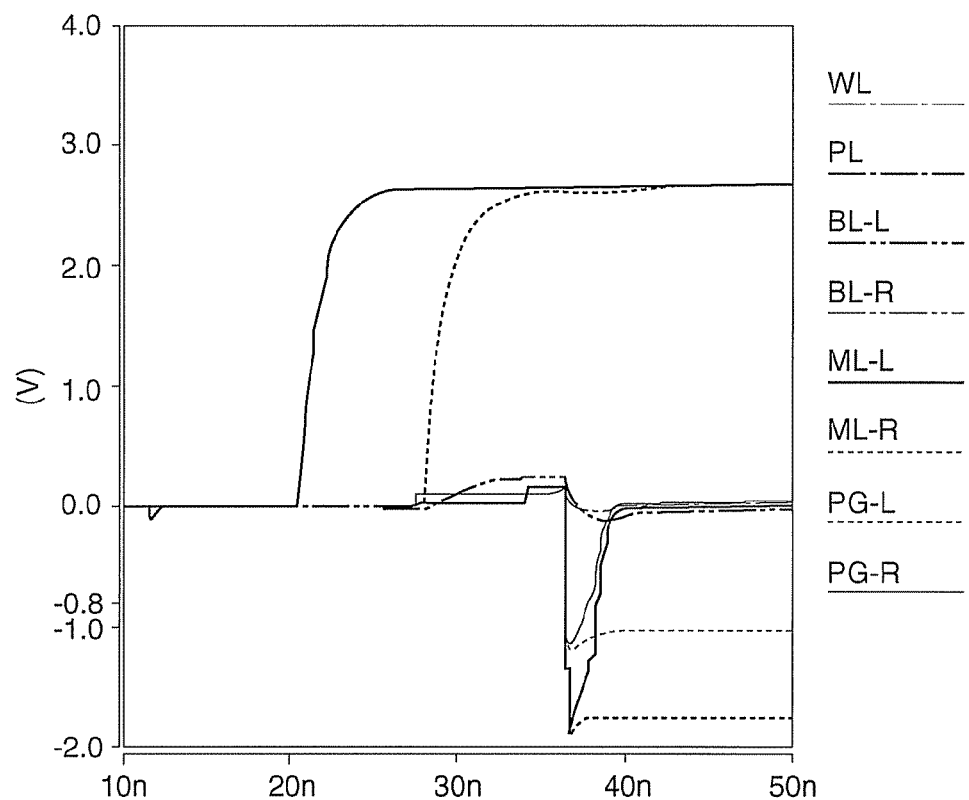
FIGS. 8A-8C show simulation results of potentials at the time of read-out on the nodes PG-L and PG-R.
Figure 8B:
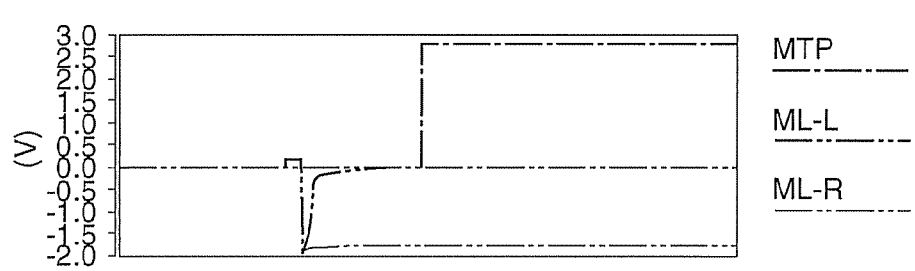
Figure 8C:
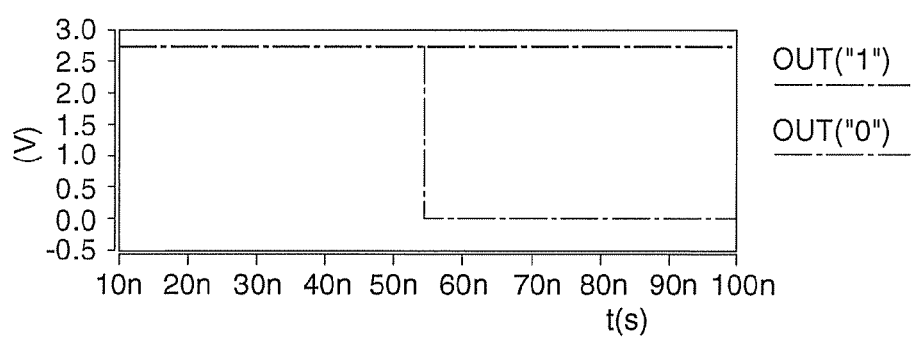

Timing charts of the second sense amplifier circuit at the time of read-out are the same as those shown in FIGS. 3A-3F. Simulation results of the potentials on the nodes PG-L and PG-R and the like at the time of read-out are shown in FIGS. 8A-8C. The potentials on the bit lines BL-L and BL-R and on the first and second nodes ML-L and ML-R change in a similar manner as those shown in FIG. 4A. As shown in FIG. 8A, as the potential on the MGEN line changes to L level, the potentials on the first and second nodes ML-L and ML-R rapidly lower, and then the p-channel type MISFETs P2-L and P2R are placed in ON state, charge is also injected from the ground potential through these MISFETs to the first and second nodes ML-L and ML-R. Therefore, the rise in the potentials on these nodes is promoted. It is noted that the potential on the node PG-R on the "0" data side rises faster than the potential on the first node ML-L. As a result, as described above, the p-channel type MISFET connected to the bit line on the "0" data side (BL-R in FIG. 8A) is quickly turned off, and the rise in the potential on the node on the "0" data side (ML-R) can be stopped much earlier. In this manner, the second sense amplifier circuit exhibits the above-described effects in addition to the effects provided by the first sense amplifier circuit.

It is noted that, as the nodes PG-L and PG-R also have negative potentials, the equalizer circuit EQ2 is provided between the nodes to fix the initial potential, whereby the read-out operation can be stabilized. As the equalizer circuit EQ2, a first, second or third equalizer circuit to be described below may be used.

It is noted that ferroelectric capacitors are used as the negative potential generation circuits in the first and second sense amplifier circuits. However, paraelectric capacitors, gate capacitors or the like may be used instead. Also, the negative potential may be applied to the first and second nodes ML-L and ML-R by a completely difference circuit method.

Furthermore, although a ferroelectric capacitor is used as the potential transfer circuit in the second sense amplifier circuit, a paraelectric capacitor, a gate capacitor or the like may be used instead.

Moreover, the sense amplifier circuit in accordance with the embodiment of the invention is applicable not only to 2T2C ferroelectric memories, but also to 1T1C ferroelectric memories in which a reference potential is applied to one of the bit lines.

2) Equalizer Circuit

Next, the structure of the equalizer circuits used in the first and second sense amplifiers is described in detail below.

First Equalizer Circuit

Figure 9:
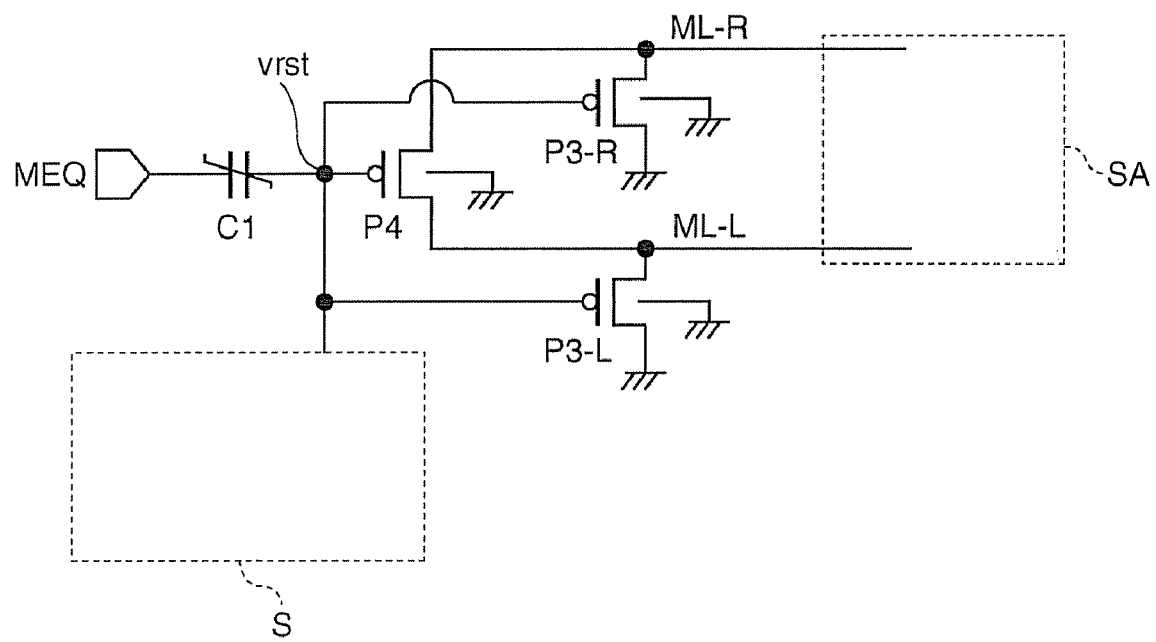
FIG. 9 is a circuit diagram of a structure of a first equalizer circuit in accordance with an embodiment of the invention.

FIG. 9 is a circuit diagram of a structure of a first equalizer circuit in accordance with an embodiment of the invention. As shown in the figure, a p-channel type MISFET P4 is connected between first and second nodes ML-L and ML-R. Also, a p-channel type MISFET P3-L is connected between the first node ML-L and the ground potential, and a p-channel type MISFET P3-R is connected between the second node ML-R and the ground potential. Gate terminals of these p-channel type MISFETs are connected to one end of a ferroelectric capacitor C1 (negative potential generation circuit), and their substrate potential is the ground potential. The negative potential generation circuit is composed of a ferroelectric capacitor C1 that is connected between an MEQ line and a node vrst. Also, a safety device (clamp circuit) S is connected to the node vrst. The safety device S controls such that the potential on the node vrst, which is placed in a floating state when the first equalizer circuit is on standby, is positioned in a specified potential range. It is noted that bit lines are connected to the first node ML-L and the second node ML-R through the sense amplifier circuit SA and the like described above.

Figure 10A:
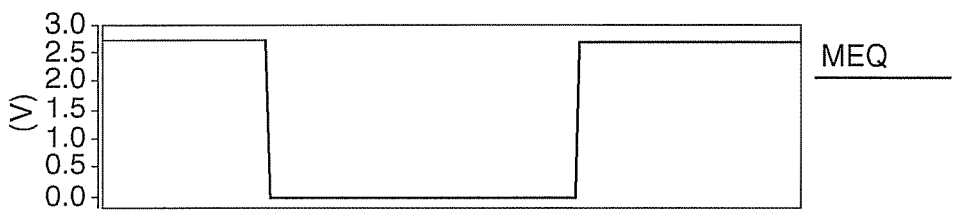
FIGS. 10A-10C are timing charts at the time of operation of the first equalizer circuit.
Figure 10B:
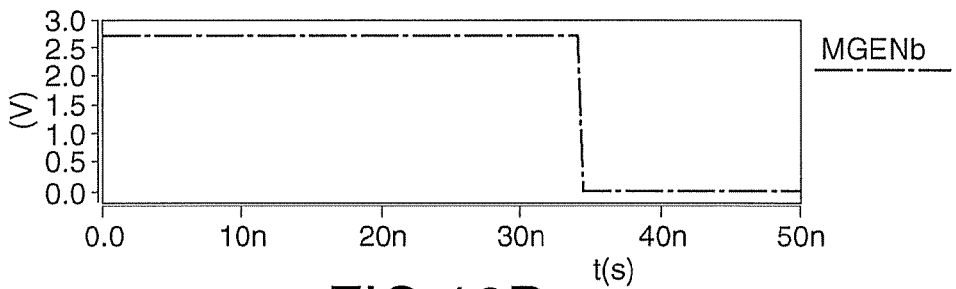
Figure 10C:
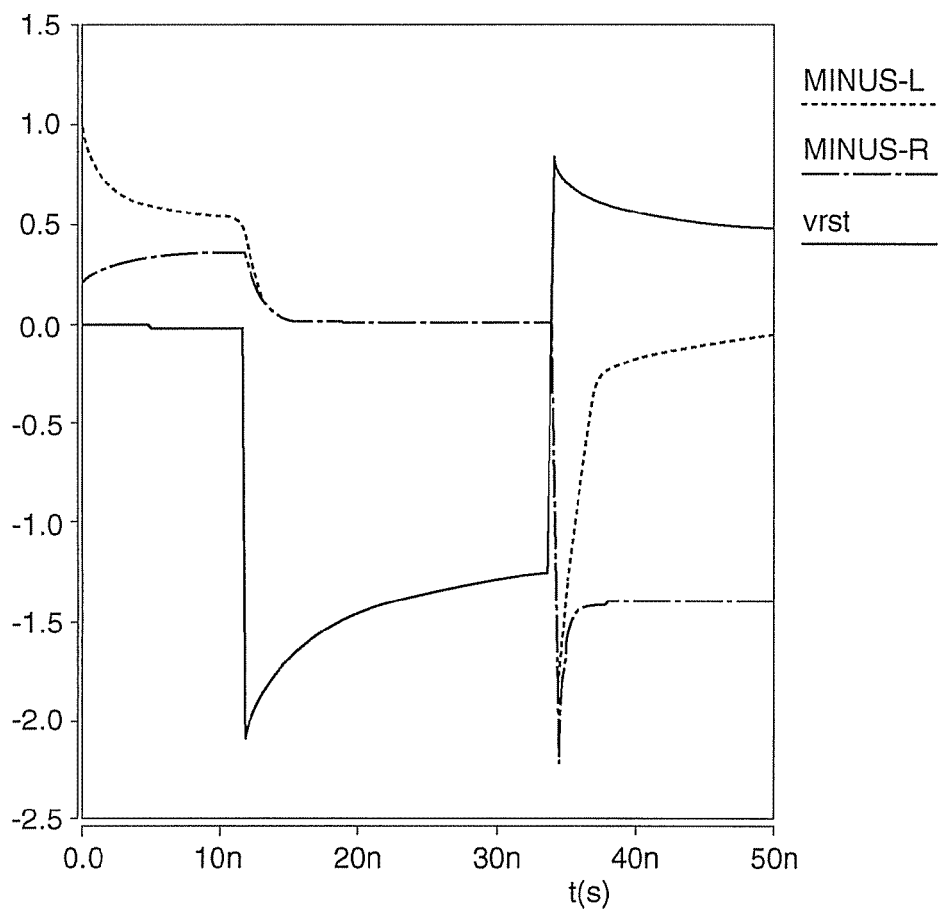

FIGS. 10A-10C are timing charts of the first equalizer circuit at the time of its operation. As shown in FIG. 10A, the potential on the MEQ line changes from H level to L level, whereby the equalizer operation starts. Accordingly, as shown in FIG. 10C, the first node ML-L and the second node ML-R so far having different potentials are equalized to the ground potential. Then, when the MEQ line becomes H level, the first equalizer circuit turns off. Further, when the potential on the MGENb line changes from H level to L level, the potentials on the first and second nodes ML-L and ML-R rapidly lower, and then rise due to the influence of the rise in the bit line potential. These changes take place in a similar manner as those described in "1) Sense Amplifier Circuit" above with reference to FIGS. 4A-4C. It is noted that MGENb indicates an inversion signal (signal line) of MGEN. Also, changes in the potential on the node vrst are also shown in the figure.

In this manner, p-channel type MISFETs are used in the equalizer circuit, such that even when the first and second nodes ML-L and ML-R become negative potential nodes, these nodes can be set to the same potential. For example, if n-channel type MISFETs were used, the potentials on the source and drain regions rise due to PN junction current, and therefore the potentials on the first and second nodes rise. Also, as the substrate potential of the p-channel type MISFET is set to the ground potential, the equalizer circuit can be turned off only by setting the gate potential to the ground potential.

In this manner, with the equalizer circuit in accordance with the present embodiment, negative potential nodes can be equalized with a relatively simple structure.

It is noted that the equalizer circuit may be formed from the p-channel type MISFET P4. However, by using the p-channel type MISFETs P3-L and P3-R, the nodes can be equalized to the ground potential. Accordingly, circuit operation in the succeeding stages, for example, the operation of the sense amplifier circuit, can be stabilized.

Figure 11:
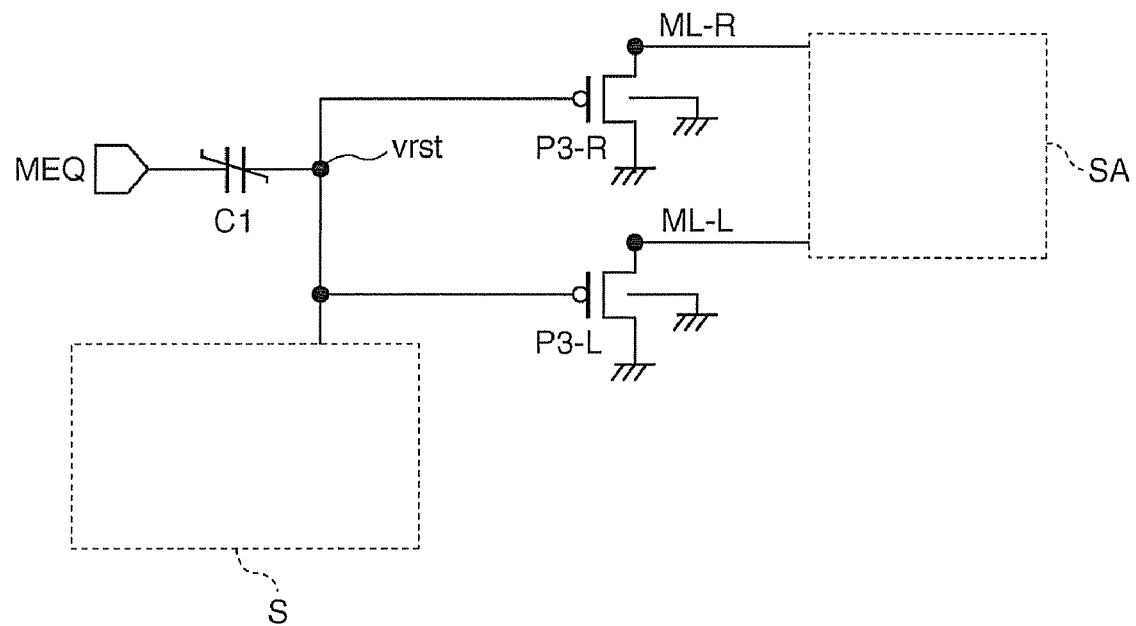
FIG. 11 is a circuit diagram of a structure of a second equalizer circuit in accordance with an embodiment of the invention.

FIG. 11 is a circuit diagram of a structure of a second equalizer circuit in accordance with an embodiment of the invention. It is different from the first equalizer circuit in that the p-channel type MISFET P4 is omitted. In this case also, the first and second nodes ML-L and ML-R can be equalized to the ground potential. Timing charts of the second equalizer circuit at the time of operation are the same as those shown in FIG. 10.

Third Equalizer Circuit

Figure 12:
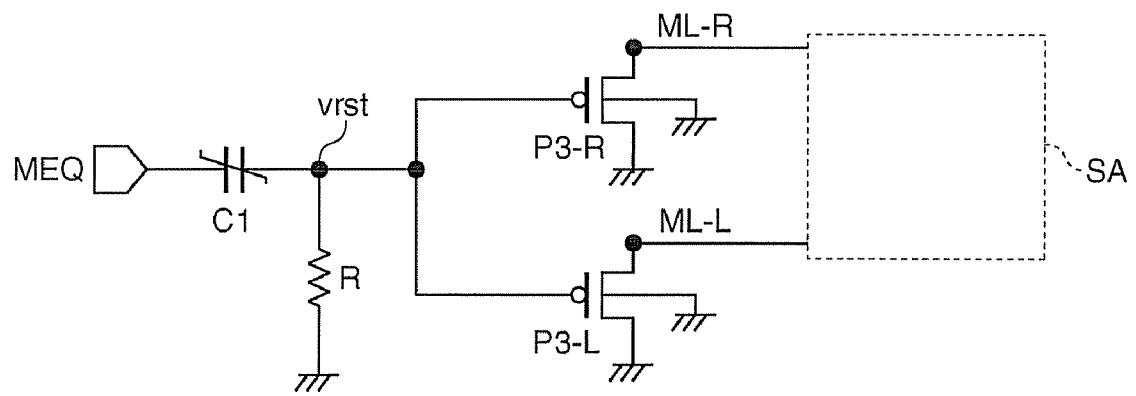
FIG. 12 is a circuit diagram of a structure of a third equalizer circuit in accordance with an embodiment of the invention.

FIG. 12 is a circuit diagram of a structure of a third equalizer circuit in accordance with an embodiment of the invention. As shown in the figure, a resistance R may also be used as the safety device S. As the resistance R, a well resistance, a polysilicon resistance (poly resistance), or a transistor resistance can be used.

Figure 13A:
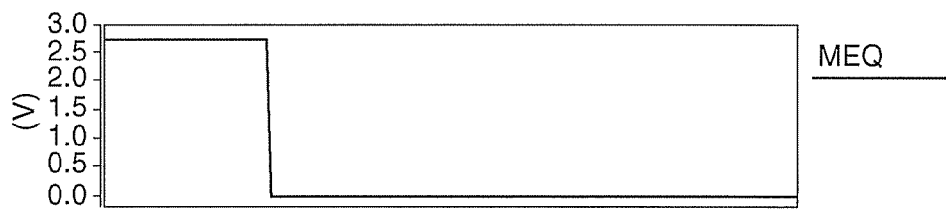
FIGS. 13A-13C are timing charts at the time of operation of the third equalizer circuit.
Figure 13B:
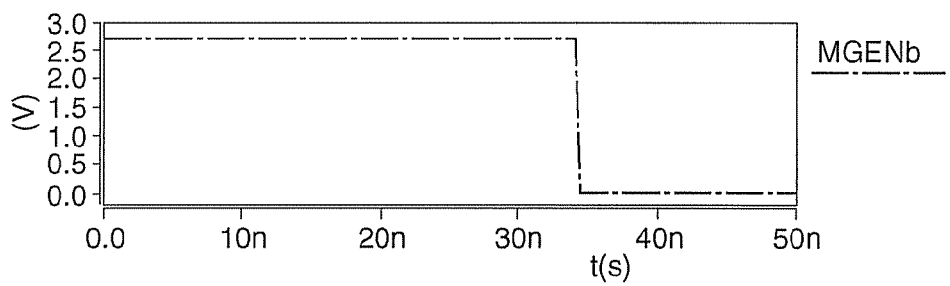
Figure 13C:
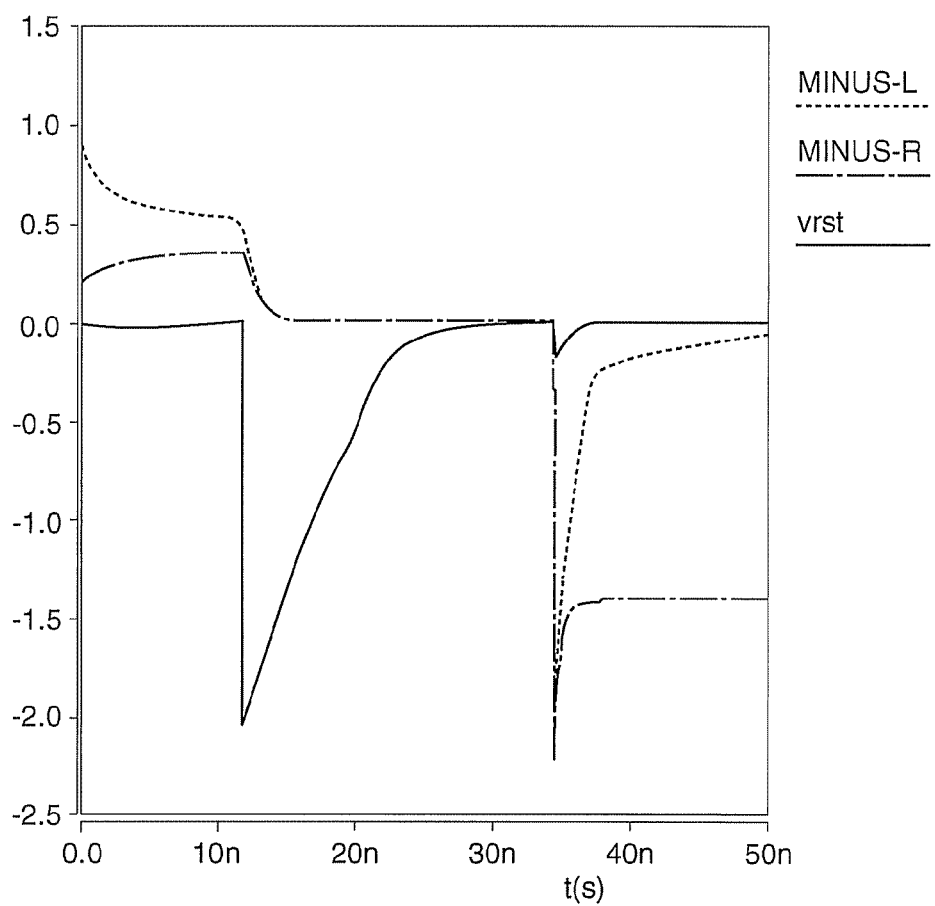

Timing charts of the third equalizer circuit at the time of operation are shown in FIGS. 13A-13C. As shown in FIG. 13A, when the potential on the MEQ line changes from H level to L level, the equalizing operation starts. Accordingly, as shown in FIG. 13C, the first and second nodes ML-L and ML-R so far having different potentials are equalized to the ground potential. Further, when the potential on the MGENb line changes from H level to L level, the potentials on the first and second nodes ML-L and ML-R rapidly lower, and then rise due to the influence of the rise in the bit line potential. These changes take place in a similar manner as those described in "1) Sense Amplifier Circuit" above with reference to FIGS. 4A-4C. It is noted that changes in the potential on the node vrst are also shown in the figure. In this case, after a predetermined time has passed from the change on the MEQ line, the node vrst becomes to be the ground potential and thus stabilizes. Accordingly, the potential on the MEQ line does not need to be changed from L level to H level.

As described above in detail, in the first-third equalizer circuits, negative potential nodes can be equalized with a relatively simple structure. Accordingly, the initial potential on the first and second nodes can be stabilized, and circuit operations in the succeeding stages, for example, the operation of the sense amplifier circuit, can be stabilized. In particular, it is more effective when the equalizer circuit in accordance with the embodiment of the invention is applied to the first and second sense amplifier circuits. In other words, in the first and second sense amplifier circuits, either the first node or the second node needs to change and exceed the threshold value Vth. Therefore, by stabilizing the initial potential on the first and second nodes, the change in the potential on the nodes can be secured.

Also, in the first and second equalizer circuits, the period in which the MEP line is at L level is an equalizing period, and therefore the equalizing period can be correctly secured by an input pulse (a change in the MEQ signal). In contrast, in the third equalizer circuit, equalization can be performed only with a simple circuit structure and simple input (for example, merely by setting the MEQ line to L level).

Figure 23:
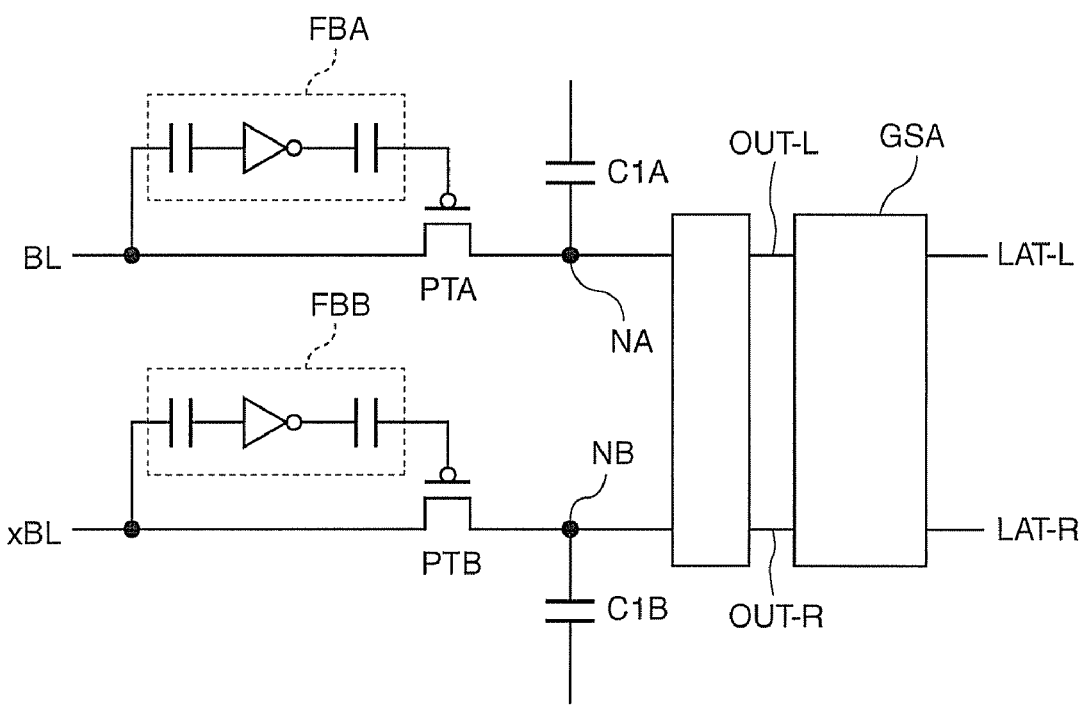
FIG. 23 is a circuit diagram of another application example of a positive potential converter circuit.

It is noted that the equalizer circuit in accordance with the invention is applicable not only to the first and second sense amplifier circuits, but also to circuits shown in FIG. 6 and FIG. 23 to be described below. More specifically, by connecting the equalizer circuit in accordance with the invention between nodes NA and NB, these nodes can have equal potentials even when these nodes become negative potential nodes.

Moreover, the equalizer circuit in accordance with the embodiment of the invention is applicable not only to 2T2C ferroelectric memories, but also to 1T1C ferroelectric memories in which a reference potential is applied to one of the bit lines.

Also, in the first-third equalizer circuits, ferroelectric capacitors are used as the negative potential generation circuits. However, paraelectric capacitors, gate capacitors or the like may be used instead. Also, the negative potential may be applied to the nodes ML-L and ML-R by a completely difference circuit method.

3) Positive Potential Converter Circuit

Next, the structure of the positive potential converter circuit used in the first and second sense amplifier circuits is described in detail.

First Positive Potential Converter Circuit

Figure 14:
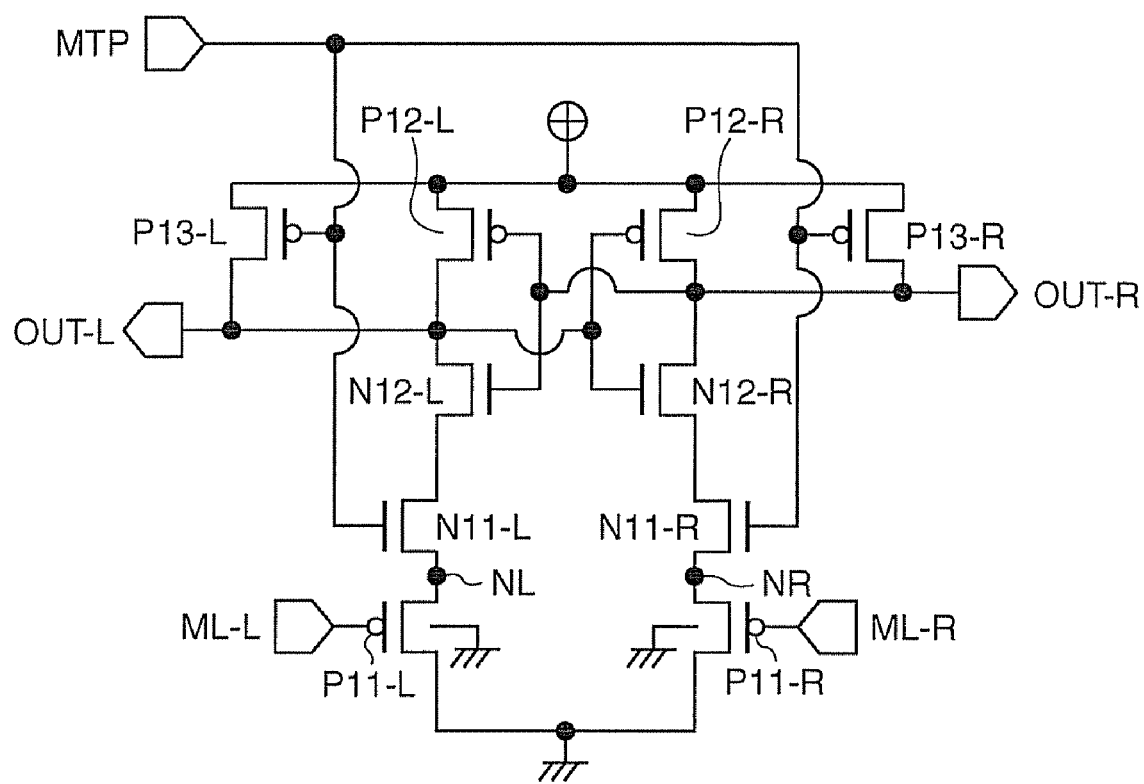
FIG. 14 is a circuit diagram of a structure of a first positive potential converter circuit in accordance with an embodiment of the invention.

FIG. 14 is a circuit diagram of a structure of a first positive potential converter circuit in accordance with an embodiment of the invention. As shown in the figure, a potential difference between the first node and the second node is taken out as outputs of cross-connected inverters. More specifically, the first positive potential converter circuit includes an inverter IN1 formed from a p-channel type MISFET P12-L and an n-channel type MISFET N12-L connected between the power supply potential and a node NL, and an inverter IN2 formed from a p-channel type MISFET P12-R and an n-channel type MISFET N12-R connected between the power supply potential and a node NR. A connection node between the p-channel type MISFET P12-L and the n-channel type MISFET N12-L defines an output section OUT-L, and the output section OUT-L is connected to a gate terminal of the p-channel type MISFET P12-R and a gate terminal of the n-channel type MISFET N12-R. A connection node between the p-channel type MISFET P12-R and the n-channel type MISFET N12-R defines an output section OUT-R, and the output section OUT-R is connected to a gate terminal of the p-channel type MISFET P12-L and a gate terminal of the n-channel type MISFET N12-L.

A p-channel type MISFET P11-L is connected between the node NL and the ground potential, and its gate terminal is connected to a first node ML-L. A p-channel type MISFET P11-R is connected between the node NR and the ground potential, and its gate terminal is connected to a second node ML-R. The substrate potential of the p-channel type MISFETs P11-L and P11-R is the ground potential.

It is noted that, for turning on the positive potential converter circuit after the potentials on the first and second nodes have been fixed, a switching transistor N11-L is connected between a first end of the n-channel type MISFET N12-L and the node NL, and a switching transistor N11-R is connected between a first end of the n-channel type MISFET N12-R and the node NR. These switching transistors are composed of n-channel type MISFETs, and gate terminals of these switching transistors are connected to a MTP line.

Also, for fixing the output sections to a specified potential, a switching transistor P13-L is connected between the power supply potential and the output section OUT-L, and a switching transistor P13-R is connected between the power supply potential and the output section OUT-R. These switching transistors are composed of p-channel type MISFETs, and gate terminals of these switching transistors are connected to the MTP line.

Figure 15A:
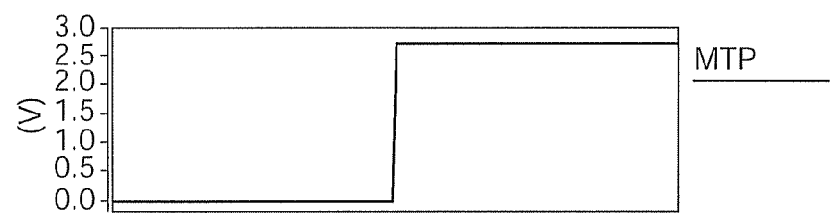
FIGS. 15A-15C are timing charts at the time of operation of the first positive potential converter circuit.
Figure 15B:
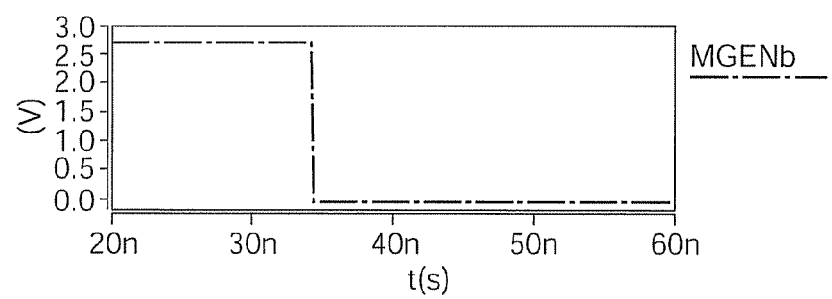
Figure 15C:
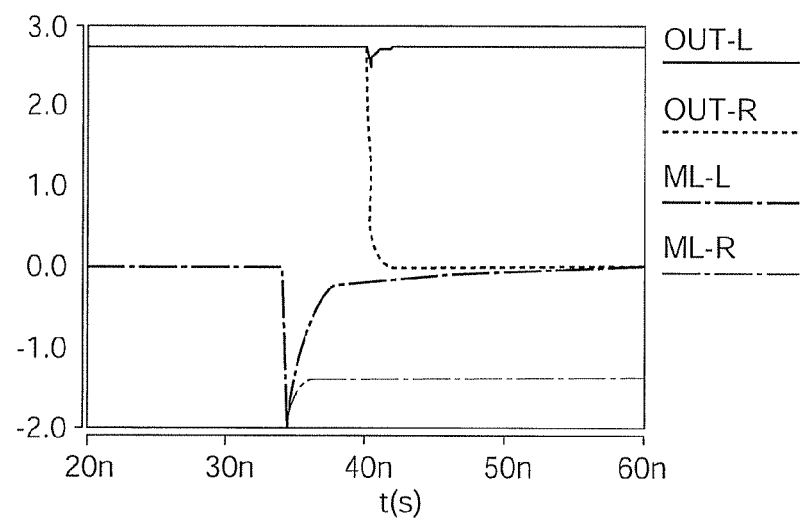

FIGS. 15A-15C are timing charts of the first positive potential converter circuit at the time of its operation. As shown in FIG. 15A, while the MTP line is at L level, the output sections OUT-L and OUT-R are pre-charged to the power supply potential (H level). By pre-charging them on standby, undesired operations of the inverters IN1 and IN2 can be prevented. Then, when the potential on the MGENb line shown in FIG. 15B changes from H level to L level, the potentials on the first and second nodes ML-L and ML-R rapidly lower, and then rise due to the influence of the rise in the bit line potential, respectively (FIG. 15C). These changes take place in a similar manner as those described in "1) Sense Amplifier Circuit" above with reference to FIGS. 4A-4C. In this instance, one of the potentials becomes higher than the threshold value Vth, and the other potential becomes lower than the threshold value Vth. Then, when the potential on the MPT line becomes H level, the positive potential converter circuit operates. In other words, the potential on the node on the "1" data side (ML-L in FIG. 15C) is higher than the threshold value Vth, such that the p-channel type MISFET P11-R is placed in ON state. Therefore, the output section OUT-R becomes L level (the ground potential). On the other hand, the output section OUT-L maintains H level (the power supply potential) (FIG. 15C).

In this manner, in the first positive potential converter circuit, outputs corresponding to the potential difference between the first and second nodes that are negative potential nodes can be taken out as H level and L level positive potentials. It is noted here that the negative potential is a potential below 0, and the positive potential is a potential above 0. Also, depending on the operation timing, the potential on the first or second node may slightly exceed 0.

Second Positive Potential Converter Circuit

Figure 16:
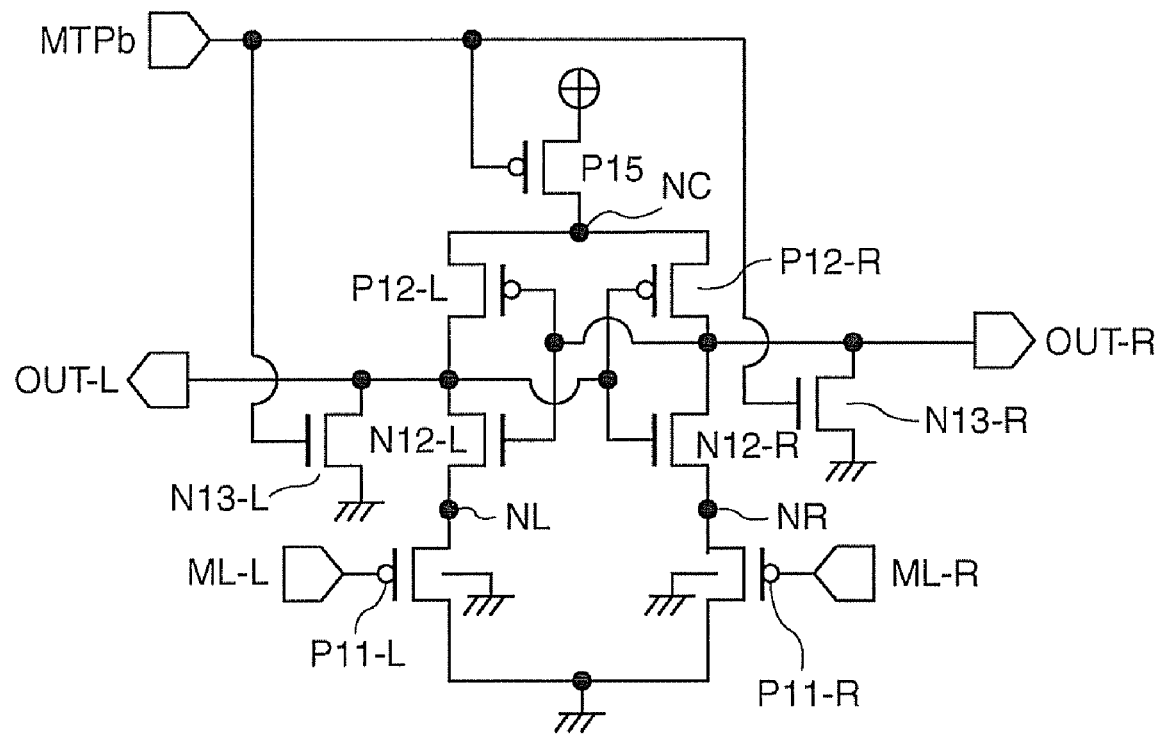
FIG. 16 is a circuit diagram of a structure of a second positive potential converter circuit in accordance with an embodiment of the invention.

FIG. 16 is a circuit diagram of a structure of a second positive potential converter circuit in accordance with an embodiment of the invention. In this case also, a potential difference between the first node and the second node is taken out as outputs of cross-connected inverters. More specifically, the second positive potential converter circuit includes an inverter IN1 formed from a p-channel type MISFET P12-L and an n-channel type MISFET N12-L connected between a node NC and a node NL, and an inverter IN2 formed from a p-channel type MISFET P12-R and an n-channel type MISFET N12-R connected between the node NC and the node NL. A connection node between the p-channel type MISFET P12-L and the n-channel type MISFET N12-L defines an output section OUT-L, and the output section OUT-L is connected to a gate terminal of the p-channel type MISFET P12-R and a gate terminal of the n-channel type MISFET N12-R. A connection node between the p-channel type MIS-FET P12-R and the n-channel type MISFET N12-R defines an output section OUT-R, and the output section OUT-R is connected to a gate terminal of the p-channel type MISFET P12-L and a gate terminal of the n-channel type MISFET N12-L.

A p-channel type MISFET P11-L is connected between the node NL and the ground potential, and its gate terminal is connected to a first node ML-L. A p-channel type MISFET P11-R is connected between the node NR and the ground potential, and its gate terminal is connected to a second node ML-R. The substrate potential of the p-channel type MISFETs P11-L and P11-R is the ground potential.

It is noted that, for turning on the positive potential converter circuit after the potentials on the first and second nodes have been fixed, a switching transistor P15 is connected between the power supply potential and the node NC. The switching transistor P15 is composed of a p-channel type MISFET, and a gate terminal of the switching transistor P15 is connected to a MTPb line. It is noted that MTPb is an inversion signal (signal line) of MTP.

Also, for fixing the output sections to a specified potential, a switching transistor N12-L is connected between the ground potential and the output section OUT-L, and a switching transistor N12-R is connected between the ground potential and the output section OUT-R. These switching transistors are composed of n-channel type MISFETs, and gate terminals of these switching transistors are connected to the MTPb line.

Figure 17A:
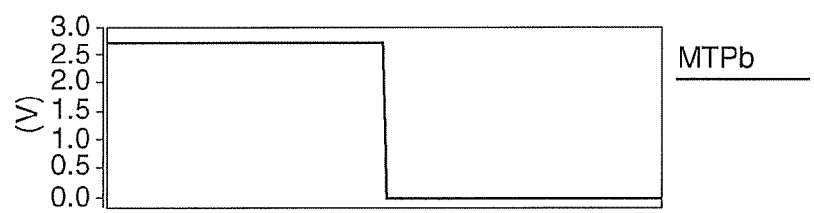
FIGS. 17A-17C are timing charts at the time of operation of the second positive potential converter circuit.
Figure 17B:
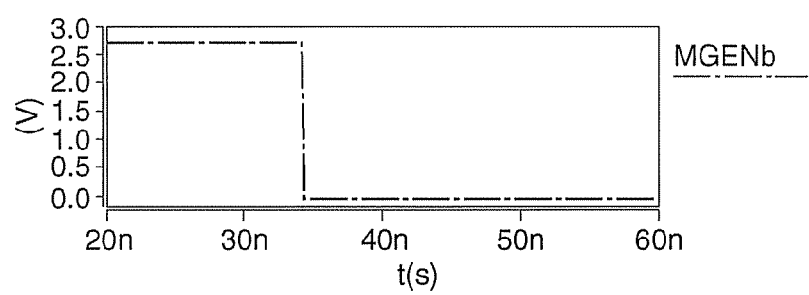
Figure 17C:
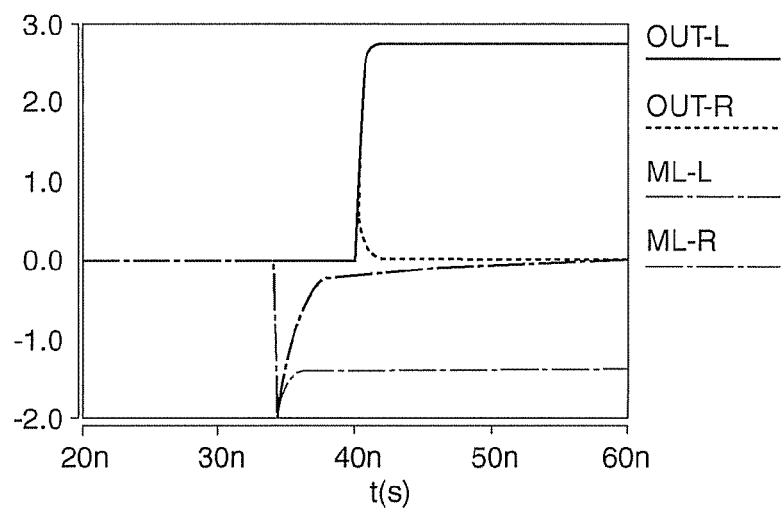

FIGS. 17A-17C are timing charts of the second positive potential converter circuit at the time of its operation. As shown in FIG. 17A, while the MTPb line is at H level, the output sections OUT-L and OUT-R are discharged to the ground potential (L level). By discharging them on standby, undesired operations of the inverters IN1 and IN2 can be prevented. Then, when the potential on the MGENb line shown in FIG. 17B changes from H level to L level, the potentials on the first and second nodes ML-L and ML-R rapidly lower, and then rise due to the influence of the rise in the bit line potential, respectively (FIG. 17C). These changes take place in a similar manner as those described in "1) Sense Amplifier Circuit" above with reference to FIGS. 4A-4C. In this instance, one of the potentials becomes higher than the threshold value Vth, and the other potential becomes lower than the threshold value Vth. Then, when the MPTb line becomes L level, the positive potential converter circuit operates. In other words, the potential on the node on the "1" data side (ML-L in FIG. 17C) is higher than the threshold value Vth, such that the p-channel type MISFET P11-R is placed in ON state. Therefore, the output section OUT-R becomes L level (the ground potential). On the other hand, when the output section OUT-L becomes L level, the p-channel type MISFET P12-L turns on, and the output section OUT-L becomes H level (the power supply potential) (FIG. 17C).

In this manner, in the second positive potential converter circuit, outputs corresponding to the potential difference between the first and second nodes that are negative potential nodes can be taken out as H level and L level outputs.

Third Positive Potential Converter Circuit

Figure 18:
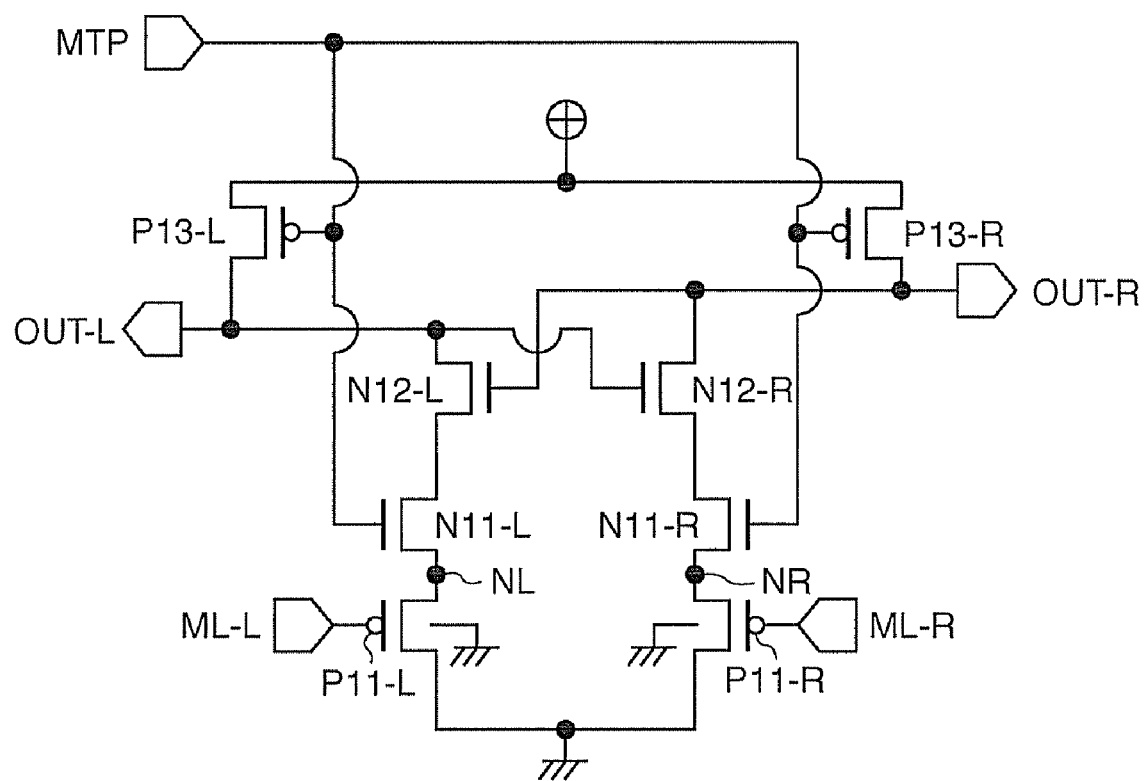
FIG. 18 is a circuit diagram of a structure of a third positive potential converter circuit in accordance with an embodiment of the invention.

FIG. 18 is a circuit diagram of a structure of a third positive potential converter circuit in accordance with an embodiment of the invention. As shown in the figure, the third positive potential converter circuit includes an n-channel type MIS-FET N12-L having a first terminal connected to a node NL, and an n-channel type MISFET N12-R having a first terminal connected to a node NR. A second terminal of the n-channel type MISFET N12-L defines an output section OUT-L, and is connected to a gate terminal of the n-channel type MISFET N12-R. A second terminal of the n-channel type MISFET N12-R defines an output section OUT-R, and is connected to a gate terminal of the n-channel type MISFET N12-L.

A p-channel type MISFET P11-L is connected between the node NL and the ground potential, and its gate terminal is connected to a first node ML-L. A p-channel type MISFET P11-R is connected between the node NR and the ground potential, and its gate terminal is connected to a second node ML-R. The substrate potential of the p-channel type MISFETs P11-L and P11-R is the ground potential.

It is noted that, for turning on the positive potential converter circuit after the potentials on the first and second nodes have been fixed, a switching transistor N11-L is connected between the n-channel type MISFET N12-L and the node NL, and a switching transistor N11-R is connected between the n-channel type MISFET N12-R and the node NR. These switching transistors are composed of n-channel type MISFETs, and gate terminals of these switching transistors are connected to a MTP line.

Also, for fixing the output sections to a specified potential, a switching transistor P13-L is connected between the power supply potential and the output section OUT-L, and a switching transistor P13-R is connected between the power supply potential and the output section OUT-R. These switching transistors are composed of p-channel type MISFETs, and gate terminals of these switching transistors are connected to the MTP line.

Figure 19A:
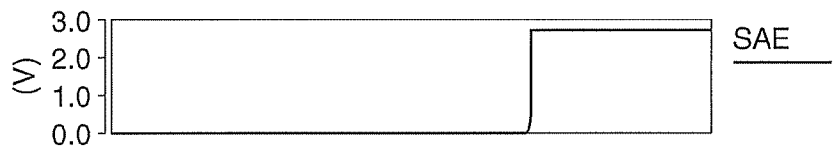
FIGS. 19A-19D are timing charts at the time of operation of the third positive potential converter circuit.
Figure 19B:
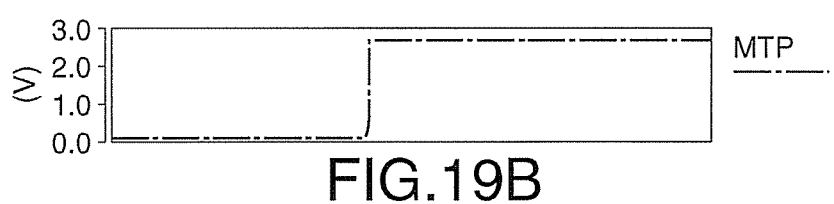
Figure 19C:
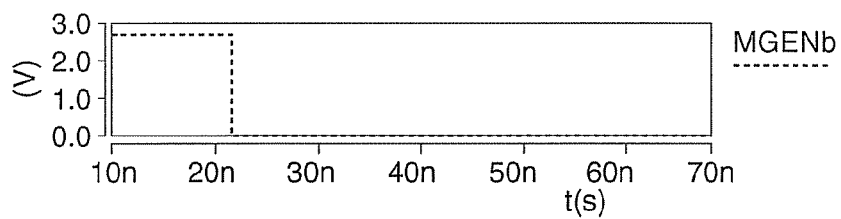
Figure 19D:
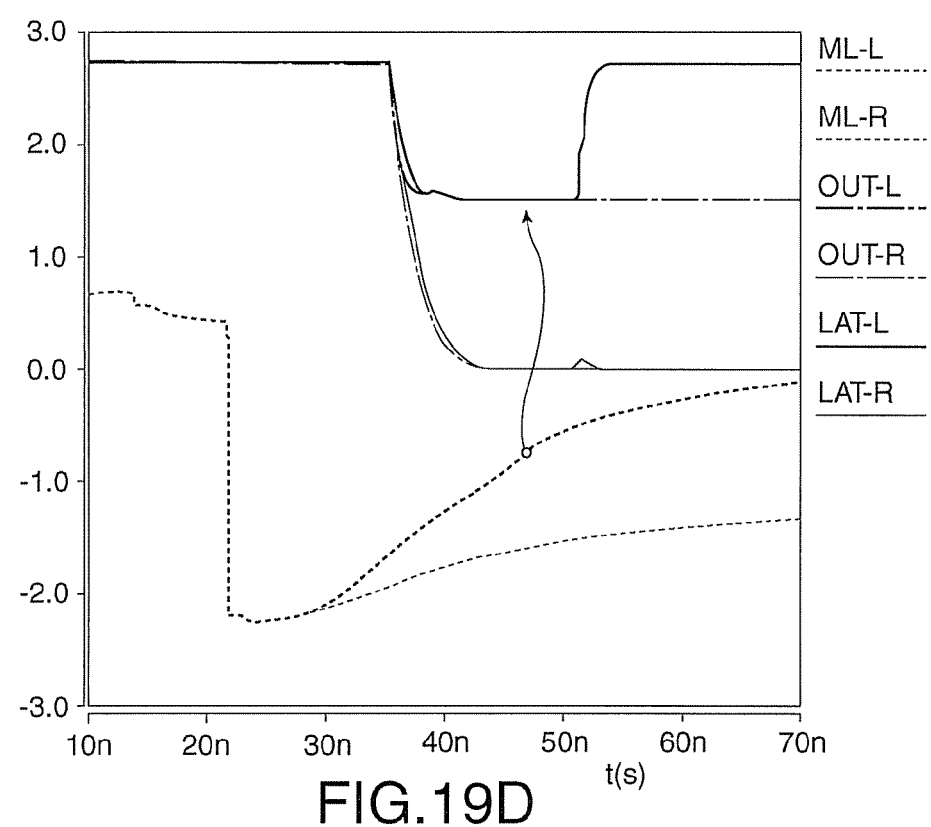

FIGS. 19A-19D are timing charts of the third positive potential converter circuit at the time of its operation. As shown in FIG. 19B, while the MTP line is at L level, the output sections OUT-L and OUT-R are pre-charged to the power supply potential (H level). Then, when the potential on the MGENb line shown in FIG. 19C changes from H level to L level, the potentials on the first and second nodes ML-L and ML-R rapidly lower, and then rise due to the influence of the rise in the bit line potential, respectively (FIG. 19D). These changes take place in a similar manner as those described in "1) Sense Amplifier Circuit" above with reference to FIGS. 4A-4C. Then, when the MPT line shown in FIG. 19B becomes H level, the third positive potential converter circuit operates.

In FIG. 19D, the potentials on the first and second nodes ML-L and ML-R have become lower than the threshold value Vth due to the aforementioned lowered potential, such that the p-channel type MISFETs P11-L and P11-R are brought in ON state. Accordingly, the potentials on the output sections OUT-L and the OUT-R lower. On the other hand, due to the rise in the potentials on the first and second nodes ML-L and ML-R, the p-channel type MISFET P11-R is placed in OFF state when one of the potentials (ML-L in FIG. 19D) exceeds the threshold value Vth. Accordingly, the output section OUT-L maintains the potential at this moment. On the other hand, the potential on the output section OUT-R lowers to the ground potential. Accordingly, thereafter, by changing the SAE signal shown in FIG. 19A from L level to H level, and amplifying the potential difference between the output section OUT-L and OUT-R by an ordinary sense amplifier, a LAT-L signal at H level and a LAT-R signal at L level can be taken out as output signals (FIG. 19D).

It is noted that, in FIG. 19D, at the time when the potential on the output section OUT-L becomes lower than the threshold value Vthn of the n-channel type MISFETN, the n-channel type MISFET N12-R turns off, and the potential on the output section OUT-L stops lowering. Either the off-timing of the n-channel type MISFET (N12-L, N12-R) or the on-timing of the p-channel type MISFET (P11-L, P11-R) may precede the other. In either of the cases, by activating the SAE line after either the potential on the first node ML-L or the second node ML-R has exceeded the threshold value Vth, more secure read-out can become possible.

Further, by adjusting the length (L) and/or width (W) of the n-channel type MISFETs (N12-L, N12-R), or by adjusting the threshold potentials through such adjustments, a large potential difference between the output sections OUT-L and OUT-R can be secured.

In this manner, also by the third positive potential converter circuit, outputs corresponding to the potential difference between the first and second nodes that are negative potential nodes can be taken out as positive potential outputs (OUT-L and OUT-R). However, in this case, the signals of the output sections OUT-L and OUT-R need to further be sensed, unlike the first and second positive potential converter circuits.

Fourth Positive Potential Converter Circuit

Figure 20:
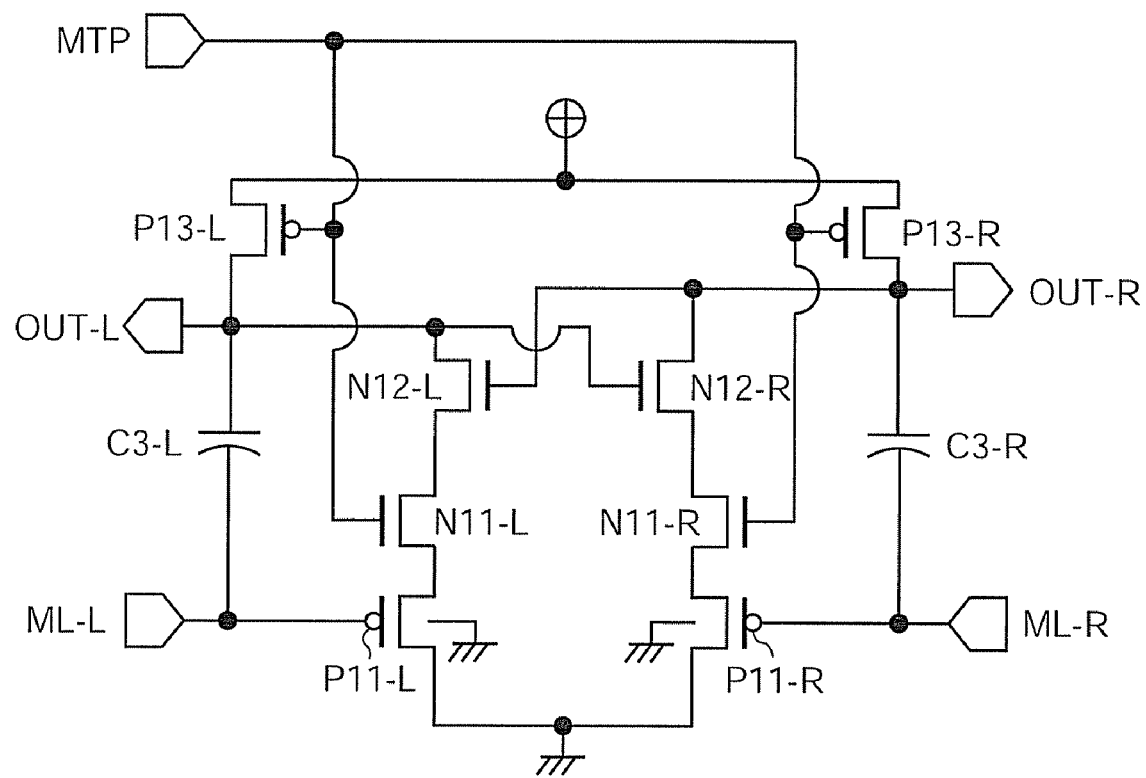
FIG. 20 is a circuit diagram of a structure of a fourth positive potential converter circuit in accordance with an embodiment of the invention.

FIG. 20 is a circuit diagram of a structure of a fourth positive potential converter circuit in accordance with an embodiment of the invention. The fourth positive potential converter circuit is characterized in having ferroelectric capacitors C3-L and C3-R further added to the third positive potential converter circuit (shown in FIG. 18). As shown in the figure, the ferroelectric capacitor C3-L is connected between the first node ML-L and the output section OUT-L, and the ferroelectric capacitor C3-R is connected between the second node ML-R and the output section OUT-R. Other details of the structure are the same as those of the third positive potential converter circuit.

In the third positive potential converter circuit, when both of the potentials on the first and second nodes ML-L and ML-R are greater than the threshold value Vth, the p-channel type MISFETs P11-L and P11-R do not turn on, such that the third positive potential converter circuit does not operate. Accordingly, the circuit design (circuit control) needs to be conducted such that the potentials on the first and second nodes ML-L and ML-R are lower than the threshold value Vth.

In contrast, in the fourth positive potential converter circuit, the reduction in the potentials on the output sections OUT-L and OUT-R can be transferred to the first and second nodes ML-L and ML-R using the ferroelectric capacitors C3-L and C3-R. Accordingly, the potentials on the first and second nodes ML-L and ML-R are lowered, such that either of the nodes can be lowered below the threshold value Vth.

Figure 21A:
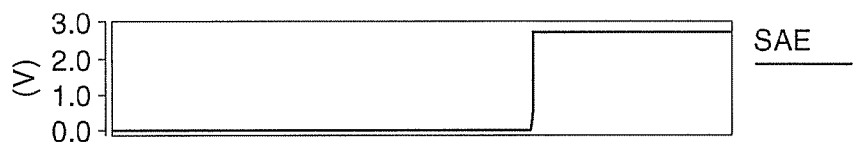
FIGS. 21A-21D are timing charts at the time of operation of the third positive potential converter circuit.
Figure 21B:
Figure 21C:
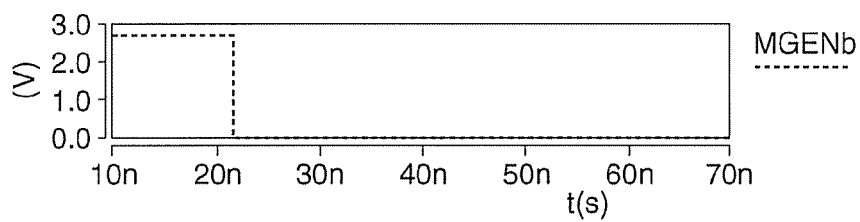
Figure 21D:
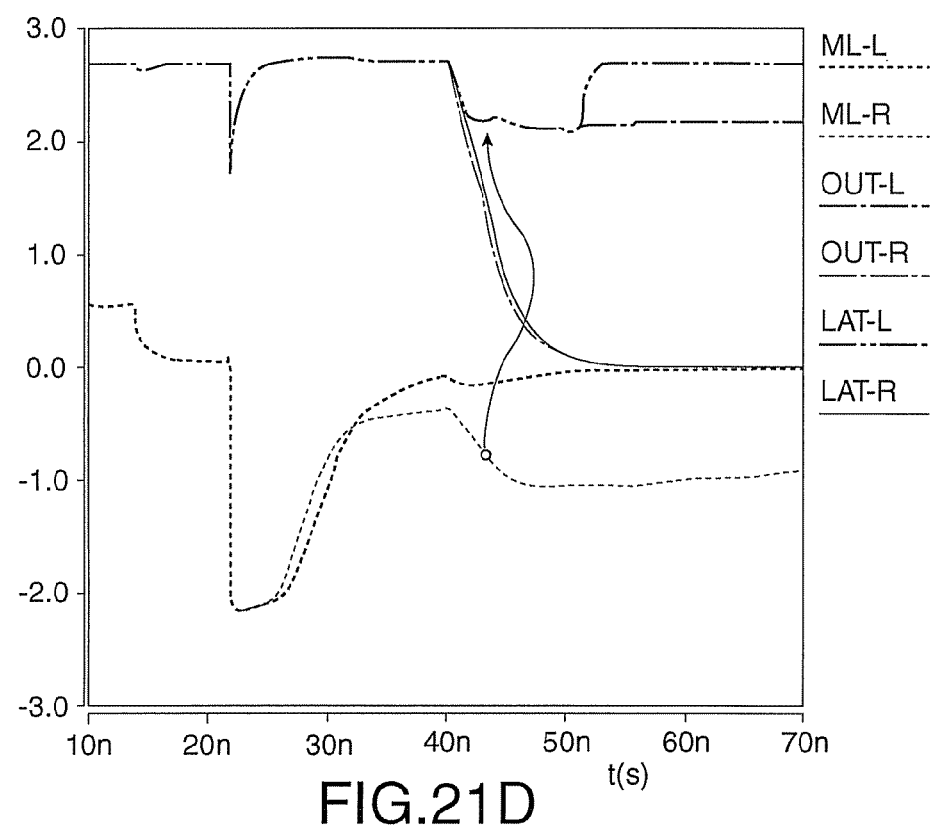

FIGS. 21A-21D are timing charts of the fourth positive potential converter circuit at the time of its operation. As shown in FIG. 21B, while the MTP line is at L level, the output sections OUT-L and OUT-R are pre-charged to the power supply potential (H level). Then, when the potential on the MGENb line shown in FIG. 21C changes from H level to L level, the potentials on the first and second nodes ML-L and ML-R rapidly lower, and then rise as they are injected with charges from the bit lines, respectively (FIG. 21D). These changes take place in a similar manner as those described in "1) Sense Amplifier Circuit" above with reference to FIGS. 4A-4C.

Then, when the potential on the MPT line shown in FIG. 21B becomes H level, the positive potential converter circuit operates. In FIG. 21D, as the potentials on the first and second nodes ML-L and ML-R are initially higher than the threshold value Vth, the p-channel type MISFETs P11-L and P11-R are in OFF state. However, the substrate potential of the p-channel type MISFETs P11-L and P11-R is the ground potential, such that current flows from the output section OUT-R into the substrate of the p-channel type MISFET P11-R through the n-channel type transistor N12-R and the switching transistor N11-R. Similarly, current flows from the output section OUT-L into the substrate of the p-channel type MISFET P11-L. Accordingly, the potentials on the output sections OUT-L and OUT-R lower.

The reduction in the potentials on the output sections OUT-L and OUT-R is transmitted through the ferroelectric capacitors C3-L and C3-R, respectively, such that the potential on the first and second nodes ML-L and ML-R lower. When the potential on the node on the "0" data side (ML-R in FIG. 21D) whose value lowers from a lower potential level exceeds the threshold value Vth, the p-channel transistor P1-R is brought in ON state. Accordingly, the potential on the output section OUT-R lowers to the ground potential. On the other hand, as the n-channel type MISFET N12-L turns off, the output section OUT-L maintains the potential at this moment. Accordingly, thereafter, by changing the SAE signal shown in FIG. 21A from L level to H level, and amplifying the potential difference between the output section OUT-L and OUT-R by an ordinary sense amplifier, a LAT-L signal at H level and a LAT-R signal at L level can be taken out (FIG. 21D).

In this manner, also by the fourth positive potential converter circuit, outputs corresponding to the potential difference between the first and second nodes that are negative potential nodes can be taken out as positive potential outputs (OUT-L and OUT-R). However, in this case, the signals of the output sections OUT-L and OUT-R need to be further sensed, unlike the first and second positive potential converter circuits.

As described above in detail, with the first-fourth positive potential converter circuits, a potential difference on negative potential nodes can be converted to a potential difference of positive potential. In the circuit for comparison in FIG. 6, negative potentials on the nodes NA and NB are converted to positive potentials by the capacitors C2A and C2B, and the potential difference thereof is amplified by an ordinary sense amplifier GSA. However, the conversion by the capacitors C2A and C2B generates a great loss. Therefore, even when a large potential difference is secured at the nodes NA and NB, the potential difference, after the conversion to the positive potentials, diminishes. In contrast, in the first-fourth positive potential converter circuits, the conversion loss can be made smaller. Accordingly, even after the conversion to the positive potentials, the potential difference (i.e., the potential difference between the output sections OUT-L and OUT-R). In other words, the sensing margin can be made greater.

Furthermore, in the first and second positive potential converter circuits, the potential difference between the output sections OUT-L and OUT-R can be taken out as H level and L level outputs. Also, these potentials can be latched (maintained).

Figure 22:
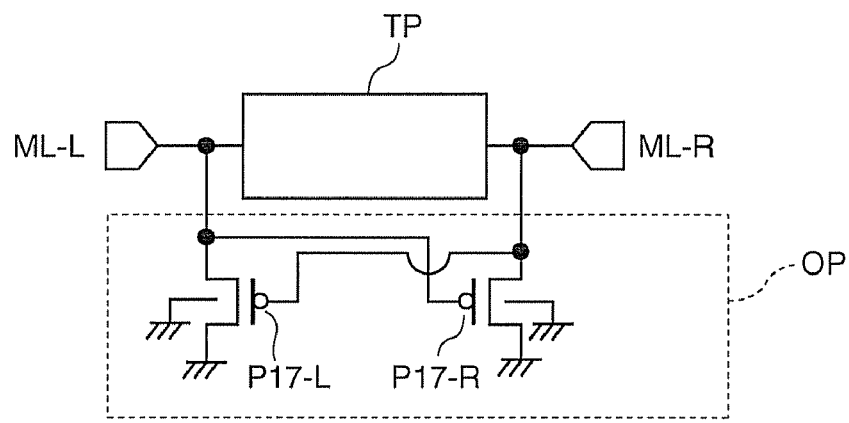
FIG. 22 is a circuit diagram of a structure of an optional circuit for a positive potential converter circuit.

It is noted that, as shown in FIG. 22, there may be provided an optional circuit OP formed from p-channel type MISFETs P17-L and P17-R connected between the first and second nodes ML-L and ML-R that are inputs of each of the first-fourth positive potential converter circuits and the ground potential, respectively. FIG. 22 is a circuit diagram of a structure of the optional circuit of the positive potential converter circuit. TP denotes any one of the first-fourth positive potential converter circuits.

As shown in the figure, a gate terminal of the p-channel type MISFET P17-L is connected to the second node ML-R, and a gate terminal of the p-channel type MISFET P17-R is connected to the first node ML-L. Furthermore, the substrate potential of the p-channel type MISFETs P17-L and P17-R is the ground potential.

By providing the optional circuit OP described above, both of the potentials on the first and second nodes can be prevented from lowering below the threshold value Vth. Accordingly, the first-fourth positive potential converter circuits would more readily operate normally.

Also, in this case, the potential on the node on the "1" data side among the first and second nodes ML-L and ML-R rises to the ground potential. Further, as a result, the potential on the output section on the "0" data side among the output sections OUT-L and OUT-R lowers to the ground potential. Therefore, designing circuits in the succeeding stages becomes easier.

As described above in detail, with the positive potential converter circuit in accordance with the invention, outputs corresponding to a potential difference between the first and second nodes that are negative potential nodes can be taken out as outputs of positive potential (OUT-L, OUT-R).

It is noted that the equalizer circuit in accordance with the invention is applicable not only to the first and second sense amplifier circuits, but also to the circuit shown in FIG. 6. In other words, as shown in FIG. 23, the positive potential converter circuit TP described above is used instead of the capacitors C2A and C2B. FIG. 23 is a circuit diagram showing another application example of the positive potential converter circuit.

In this case, the nodes NA and NB are connected to the input sections, and outputs corresponding to the potential difference on the nodes NA and NB that are negative potential nodes can be taken out as positive potential outputs (OUT-L, OUT-R). However, in this case, the third and fourth positive potential converter circuits may preferably be used at the TP section. This is because, in this case, the potentials on the nodes NA and NB can be set regardless of the threshold value Vth. Accordingly, signals on the output sections OUT-L and OUT-R are further sensed by an ordinary sense amplifier circuit GSA, whereby output signals LAT-L and LAT-R are taken out.

It is noted that the first and second positive potential converter circuits may be used depending on the relation between the potentials on the nodes NA and NB and the threshold value Vth. In other words, the ordinary sense amplifier circuit GSA may possibly be omitted. Also, by adding the optional circuit OP described above, the first and second positive potential converter circuits can be used.

Also, the positive potential converter circuit in accordance with the invention is applicable not only to a 2T2C ferroelectric memory, but also to a 1T1C ferroelectric memory in which a reference potential is applied to one of the bit lines.

Moreover, in the fourth positive potential converter circuit, the ferroelectric capacitors are used for potential transfer, but paraelectric capacitors, gate capacitors or the like may be used instead.

The embodiment examples and application examples described above in accordance with the embodiments of the invention may be used, appropriately combined, modified or improved according to the usage, and the invention is not limited to the description of the embodiments described above. It is obvious from the description in the scope of claimed invention that such combined, modified or improved embodiments can also be included in the technical scope of the invention.

What is claimed is:

1. A ferroelectric memory device comprising:
   a first p-channel type MISFET connected between a first bit line and a first node;
   a second p-channel type MISFET connected between a second bit line and a second node;
   a first negative potential generation circuit connected to the first node;

a second negative potential generation circuit connected to the second node; and a charge supply circuit connected to the first node and the second node, wherein a gate terminal of the first p-channel type MISFET and the second node are connected to each other, and a gate terminal of the second p-channel type MISFET and the first node are connected to each other, wherein the charge supply circuit is composed of a third p-channel type MISFET and a fourth p-channel type MISFET, wherein the third p-channel type MISFET has one end connected to the first node, another end connected to a first potential, and a gate terminal connected to the second node, and wherein the fourth p-channel type MISFET has one end connected to the second node, another end connected to the first potential, and a gate terminal connected to the first node.

2. A ferroelectric memory device according to claim 1, wherein, a substrate potential of the first p-channel type MISFET and the second p-channel type MISFET is a ground potential.

3. A ferroelectric memory device according to claim 1, wherein the substrate potential of the first p-channel type MISFET is equal to a potential on the terminal of the first p-channel type MISFET on the side of the first bit line, and the substrate potential of the second p-channel type MISFET is equal to the potential on the terminal of the second p-channel type MISFET on the side of the second bit line.

4. A ferroelectric memory device according to claim 1, wherein the first negative potential generation circuit is composed of a first capacitor connected between the first node and a first line, and the second negative potential generation circuit is composed of a second capacitor connected between the second node and the first line.

5. A ferroelectric memory device according to claim 4, wherein each of the first capacitor and the second capacitor is composed of a ferroelectric capacitor.

6. A ferroelectric memory device according to claim 1, comprising a discharge circuit connected to the first bit line and the second bit line.

7. A ferroelectric memory device according to claim 1, wherein the substrate potential of the third p-channel type MISFET is equal to the ground potential or a potential on the terminal of the first p-channel type MISFET on the first bit line side, and the substrate potential of the fourth p-channel type MISFET is equal to the ground potential or a potential on the terminal of the second p-channel type MISFET on the second bit line side.

8. A ferroelectric memory device according to claim 1, wherein the gate terminal of the third p-channel type MISFET and the second node are connected to each other through a third capacitor, and the gate terminal of the fourth p-channel type MISFET and the first node are connected to each other through a fourth capacitor.

9. A ferroelectric memory device according to claim 1, comprising a first equalizer circuit connected between the first node and the second node for setting the potentials thereon to a specified potential.

10. A ferroelectric memory device according to claim 9, wherein the first equalizer circuit is composed of a fifth p-channel type MISFET, wherein the fifth p-channel type MISFET has one end connected to the first node, another end connected to the second node, and a gate terminal connected to a third negative potential generation circuit, and a substrate potential of the fifth p-channel type MISFET is a first potential.

11. A ferroelectric memory device according to claim 10, wherein the first equalizer circuit further includes a sixth p-channel type MISFET and a seventh p-channel type MISFET, wherein the sixth p-channel type MISFET has one end connected to the first node, another end connected to the first potential, and a gate terminal connected to the third negative potential generation circuit, and a substrate potential of the sixth p-channel type MISFET is the first potential; and the seventh p-channel type MISFET has one end connected to the second node, another end connected to the first potential, and a gate terminal connected to the third negative potential generation circuit, and a substrate potential of the seventh p-channel type MISFET is the first potential.

12. A ferroelectric memory device according to claim 9, comprising a clamp circuit connected to an output of the third negative potential generation circuit.

13. A ferroelectric memory device according to claim 12, wherein the clamp circuit is a resistance connected between the output and the first potential.

14. A ferroelectric memory device according to claim 8, comprising a second equalizer circuit connected between the gate terminal of the third p-channel type MISFET and the gate terminal of the fourth p-channel type MISFET for setting the potential on the gate terminals at a specified potential.

15. A ferroelectric memory device according to claim 1, comprising a positive potential converter circuit having an input section connected to the first node and the second node, wherein the positive potential converter circuit converts a potential on the first node to a second potential that is a positive potential and a potential on the second node to a third potential that is lower than the second potential when the potential on the first node is higher than the potential on the second node, and converts a potential on the second node to the second potential and a potential on the first node to the third potential when the potential on the second node is higher than the potential on the first node.

16. A ferroelectric memory device according to claim 15, wherein, at the time of operation of the positive potential converter circuit, the potentials on the first and second nodes are a negative potential or the ground potential.

17. A ferroelectric memory device according to claim 1, wherein a ferroelectric memory is connected to each of the first bit line and the second bit line.

18. A ferroelectric memory device according to claim 1, wherein a ferroelectric memory is connected to the first bit line, and a reference potential is applied to the second bit line.

19. An electronic apparatus comprising the ferroelectric memory device recited in claim 1.

* * * * *